United States Patent
Basrur et al.

(10) Patent No.: US 11,749,783 B2
(45) Date of Patent: Sep. 5, 2023

(54) LIGHT EMITTING DEVICE, MANUFACTURING METHOD THEREOF, AND DISPLAY DEVICE HAVING SAME

(71) Applicant: SAMSUNG DISPLAY CO., LTD., Yongin-si (KR)

(72) Inventors: Veidhes Basrur, Yongin-si (KR); Xinxing Li, Yongin-si (KR); Hee Keun Lee, Yongin-si (KR); Chang Il Tae, Yongin-si (KR); Tae Jin Kong, Yongin-si (KR); Myeong Hee Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 26 days.

(21) Appl. No.: 17/263,391

(22) PCT Filed: Jan. 17, 2019

(86) PCT No.: PCT/KR2019/000711
§ 371 (c)(1),
(2) Date: Jan. 26, 2021

(87) PCT Pub. No.: WO2020/022596
PCT Pub. Date: Jan. 30, 2020

(65) Prior Publication Data
US 2021/0167253 A1  Jun. 3, 2021

(30) Foreign Application Priority Data

Jul. 27, 2018 (KR) .......... 10-2018-0087701

(51) Int. Cl.
*H01L 33/38* (2010.01)
*H01L 27/15* (2006.01)
(Continued)

(52) U.S. Cl.
CPC .......... *H01L 33/387* (2013.01); *H01L 27/156* (2013.01); *H01L 33/005* (2013.01);
(Continued)

(58) Field of Classification Search
CPC ..... H01L 33/385; H01L 33/387; H01L 33/62; H01L 33/647; H01L 27/153;
(Continued)

(56) References Cited

U.S. PATENT DOCUMENTS 6,018,167 A * 1/2000 Oota .......... H01L 33/44
257/79
8,872,214 B2  10/2014 Negishi et al.
(Continued)

FOREIGN PATENT DOCUMENTS

EP  2 592 672  5/2013
JP  4814394  11/2011
(Continued)

OTHER PUBLICATIONS

International Search Report, with English translation, corresponding to International Application No. PCT/KR2019/000711 dated Apr. 26, 2019.
(Continued)

*Primary Examiner* — Latanya N Crawford Eason
(74) *Attorney, Agent, or Firm* — KILE PARK REED & HOUTTEMAN PLLC

(57) ABSTRACT

A light emitting device includes first and second electrodes disposed on a substrate and spaced apart from each other; at least one light emitting diode disposed between the first and second electrodes; an insulating pattern overlapping an upper portion of the at least one light emitting diode and exposing first and second ends of the at least one light emitting diode; a first contact electrode electrically connecting the first end of the at least one light emitting diode to the
(Continued)

first electrode; and a second contact electrode electrically connecting the second end of the at least one light emitting diode to the second electrode. The insulating pattern may completely overlap the first and second ends of the at least one light emitting diode in a plan view, and have a width reducing toward a lower portion of the insulating pattern.

20 Claims, 15 Drawing Sheets

(51) Int. Cl.
*H01L 33/00* (2010.01)
*H01L 33/40* (2010.01)
*H01L 33/62* (2010.01)

(52) U.S. Cl.
CPC ............ *H01L 33/405* (2013.01); *H01L 33/62* (2013.01); *H01L 2933/0016* (2013.01)

(58) Field of Classification Search
CPC ............... H01L 27/156; H01L 27/3248; H01L 51/5206; H01L 25/0753; H01L 25/115; H01L 25/167; H01L 33/005; H01L 33/405; H01L 33/54; H01L 33/58
See application file for complete search history.

(56) References Cited

U.S. PATENT DOCUMENTS

| | | | |
|---|---|---|---|
| 9,287,242 | B2 | 3/2016 | Shibata et al. |
| 9,570,425 | B2 | 2/2017 | Do |
| 9,773,761 | B2 | 9/2017 | Do |
| 9,847,502 | B2 | 12/2017 | Moon et al. |
| 10,158,036 | B2 | 12/2018 | Usami |
| 10,177,278 | B2 | 1/2019 | Kim et al. |
| 10,249,603 | B2 | 4/2019 | Cho et al. |
| 10,672,946 | B2 | 6/2020 | Cho et al. |
| 2006/0243999 | A1 | 11/2006 | Shen |
| 2006/0255726 | A1 | 11/2006 | Kim |
| 2011/0089850 | A1 | 4/2011 | Shibata et al. |
| 2012/0326181 | A1 | 12/2012 | Shibata et al. |
| 2017/0358563 | A1* | 12/2017 | Cho ........................ H01L 33/38 |
| 2018/0012876 | A1 | 1/2018 | Kim et al. |
| 2018/0019369 | A1 | 1/2018 | Cho et al. |
| 2019/0115513 | A1* | 4/2019 | Im ........................ H05K 1/0296 |

FOREIGN PATENT DOCUMENTS

| | | |
|---|---|---|
| JP | 4914929 | 4/2012 |
| JP | 2017-55020 | 3/2017 |
| JP | 2017-201649 | 11/2017 |
| KR | 10-1436123 | 11/2014 |
| KR | 10-1490758 | 2/2015 |
| KR | 10-2015-0037708 | 4/2015 |
| KR | 10-2017-0063326 | 6/2017 |
| KR | 10-2018-0007376 | 1/2018 |
| KR | 10-2018-0009014 | 1/2018 |
| KR | 10-2018-0009436 | 1/2018 |
| KR | 10-2018-0072909 | 7/2018 |
| KR | 10-1987196 | 6/2019 |
| KR | 10-2020-0006650 | 1/2020 |

OTHER PUBLICATIONS

Written Opinion, with English translation, corresponding to International Application No. PCT/KR2019/000711, dated Apr. 26, 2019.
Notice of Allowance with English translation for Korean Patent Application No. 10-2018-0087701, dated Apr. 18, 2023.

* cited by examiner

FIG. 3A
FIG. 3B
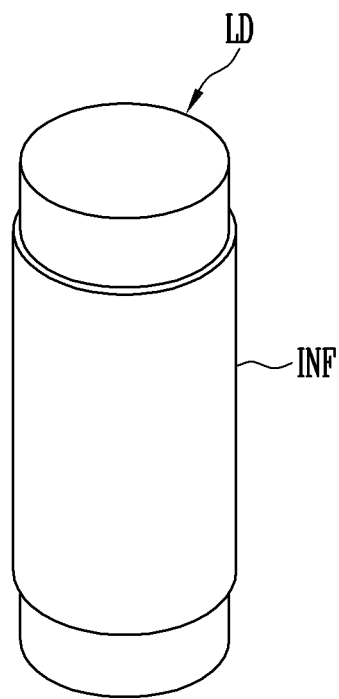
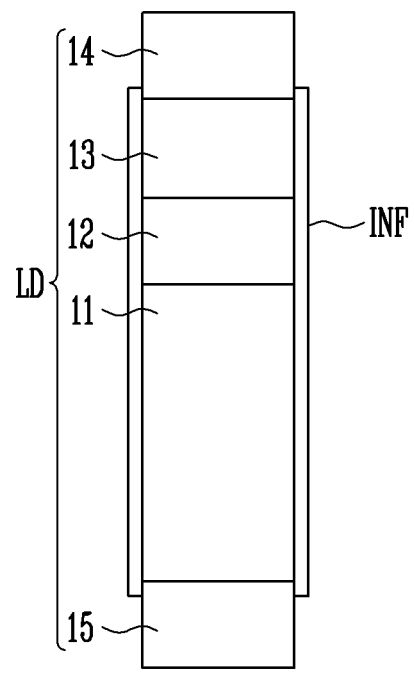

LIGHT EMITTING DEVICE, MANUFACTURING METHOD THEREOF, AND DISPLAY DEVICE HAVING SAME

CROSS-REFERENCE TO RELATED APPLICATION

This application is a national entry of International Application No. PCT/KR2019/000711, filed on Jan. 17, 2019, which claims under 35 U.S.C. §§ 119(a) and 365(b) priority to and benefits of Korean Patent Application No. 10-2018-0087701, filed on Jul. 27, 2018 in the Korean Intellectual Property Office (KIPO), the entire contents of all of which are incorporated herein by reference.

BACKGROUND

1. Technical Field

The disclosure relates to a light emitting device, a method of fabricating the light emitting device, and a display device having the light emitting device.

2. Description of the Related Art

Recently, technologies of manufacturing a subminiature light emitting diode using a material having a reliable inorganic crystal structure and manufacturing a light emitting device using the light emitting diode have been developed. For example, a light emitting device using a subminiature light emitting diode having a small size corresponding to a microscale size or a nanoscale size has been developed. Such a light emitting device may be used as a light source in various electronic devices such as a display device and a lighting device.

SUMMARY

Various embodiments of the present disclosure are directed to a light emitting device including a light emitting diode, a method of fabricating the light emitting device, and a display device including the light emitting device.

According to an aspect of the disclosure, a light emitting device may include a first electrode and a second electrode disposed on a substrate and spaced apart from each other; at least one light emitting diode disposed between the first electrode and the second electrode, the at least one light emitting diode including a first end and a second end on sides in a longitudinal direction of the at least one light emitting diode; an insulating pattern overlapping an upper portion of the at least one light emitting diode and exposing the first and the second ends of the at least one light emitting diode; a first contact electrode electrically connecting the first end of the at least one light emitting diode to the first electrode; and a second contact electrode electrically connecting the second end of the at least one light emitting diode to the second electrode. The insulating pattern may completely overlap the first and the second ends of the at least one light emitting diode in a plan view, and the insulating patter may have a shape in which a width of the insulating patter reduces toward a lower portion of the insulating pattern in a cross-sectional view.

In an embodiment, the first and the second contact electrodes may electrically contact side surfaces of the at least one light emitting diode on the first and the second ends of the at least one light emitting diode, respectively. An end of each of the first and the second contact electrodes may electrically contact the lower portion of the insulating pattern without extending to an upper surface of the at least one light emitting diode.

In an embodiment, the at least one light emitting diode may be disposed between the first and second contact electrodes which are spaced apart from each other, and the first and second contact electrodes may be disposed on a same layer or at a same height.

In an embodiment, the insulating pattern may include a first side surface disposed on the first end of the at least one light emitting diode, the first side surface including an inclined surface or a curved surface; and a second side surface disposed on the second end of the at least one light emitting diode, the second side surface including an inclined surface or a curved surface.

In an embodiment, an upper end of the first side surface may be spaced apart from the first end of the at least one light emitting diode in a direction toward the first electrode by a distance equal to or greater than a thickness of the first and the second contact electrodes in a plan view. An upper end of the second side surface may be spaced apart from the second end of the at least one light emitting diode in a direction toward the second electrode by a distance equal to or greater than the thickness of the first and the second contact electrodes in the plan view.

In an embodiment, the insulating pattern may have a thickness equal to or greater than a thickness of each of the first and the second contact electrodes.

In an embodiment, the light emitting device may further include at least one first insulating layer disposed between the first electrode and a portion of the first contact electrode; and at least one second insulating layer disposed between the second electrode and a portion of the second contact electrode.

In an embodiment, the insulating pattern may have a thickness less than a thickness of each of the first and the second insulating layers.

In an embodiment, an upper surface of the insulating pattern may have a width greater than a length of the at least one light emitting diode.

In an embodiment, the light emitting device may further include a conductive pattern disposed on the insulating pattern, overlapping the at least one light emitting diode, and separated from the at least one light emitting diode and the first and the second contact electrodes by the insulating pattern.

In an embodiment, the conductive pattern may include a material identical to a material of the first and the second contact electrodes and is electrically isolated.

In an embodiment, the light emitting device may further include a third insulating layer disposed between the substrate and the at least one light emitting diode.

In an embodiment, the at least one light emitting diode may be horizontally disposed on a surface of the substrate and oriented in a lateral direction of the light emitting device between the first electrode and the second electrode.

In an embodiment, the at least one light emitting diode may include a rod-type light emitting diode having a diameter or a length in a range of nanoscale to microscale.

According to an aspect of the disclosure, a method of fabricating a light emitting device may include forming first and second electrodes spaced apart from each other on a substrate; forming a first insulating material layer on the substrate on which the first and the second electrodes are formed; supplying at least one light emitting diode on the substrate on which the first insulating material layer is formed; aligning the at least one light emitting diode between the first and the second electrodes such that first and second ends of the at least one light emitting diode are respectively adjacent to the first and the second electrodes; forming a second insulating material layer on the substrate on which the at least one light emitting diode is aligned; forming a mask on the substrate on which the second insulating material layer is formed; etching the first and the second insulating material layers such that at least a portion of the first electrode, at least a portion of the second electrodes, and the first and the second ends of the at least one light emitting diode are exposed; and forming first and second contact electrodes electrically connecting the first and the second ends of the at least one light emitting diode to the first and the second electrodes, respectively. The etching of the first and the second insulating material layers may include etching the second insulating material layer over sides of the at least one light emitting diode on which the first and the second ends are located, and forming an insulating pattern to completely overlap the first and the second ends of the at least one light emitting diode in a plan view and to have a width reducing toward a portion of the insulating patter adjacent to the at least one light emitting diode.

In an embodiment, the forming of the mask may include forming a photoresist layer on the substrate on which the second insulating material layer is formed; and forming first and second openings in the photoresist layer so that the second insulating material layer over the first and the second electrodes is partially exposed at positions respectively spaced apart from the first and the second ends by a predetermined distance.

In an embodiment, the forming of the first and second contact electrodes may comprise forming a conductive pattern separated from the at least one light emitting diode and the first and the second contact electrodes on the insulating pattern.

In an embodiment, the first and the second electrodes may be simultaneously formed on a same layer.

In an embodiment, the first and the second contact electrodes may be simultaneously formed on a same layer.

According to an aspect of the disclosure, a display device may include a substrate including a display area; and a pixel disposed in the display area, the pixel comprising a first electrode and a second electrode disposed on the substrate and spaced apart from each other; at least one light emitting diode disposed between the first electrode and the second electrode, the at least one light emitting diode including a first end and a second end on sides in a longitudinal direction of the at least one lighting emitting diode; an insulating pattern disposed to overlap an upper portion of the at least one light emitting diode and exposing the first and second ends of the at least one light emitting diode; a first contact electrode electrically connecting the first end of the at least one light emitting diode to the first electrode; and a second contact electrode electrically connecting the second end of the at least one light emitting diode to the second electrode. The insulating pattern may completely overlap the first and the second ends of the at least one light emitting diode in a plan view, and may have a shape in which a width of the insulating pattern reduces toward a lower portion of the insulating pattern in a cross-sectional view.

In a light emitting device, a method of fabricating the light emitting device, and a display device including the light emitting device in accordance with embodiments of the disclosure, a light emitting diode may be reliably connected between a first electrode and a second electrode, and a fabricating process may also be simplified.

BRIEF DESCRIPTION OF THE DRAWINGS

An additional appreciation according to the embodiments of the invention will become more apparent by describing in detail the embodiments thereof with reference to the accompanying drawings, wherein:

FIGS. 3A and 3B are a schematic perspective diagram and a schematic cross-sectional diagram, respectively, illustrating a light emitting diode in accordance with an embodiment.

DETAILED DESCRIPTION OF THE EMBODIMENTS

Figure 1A:
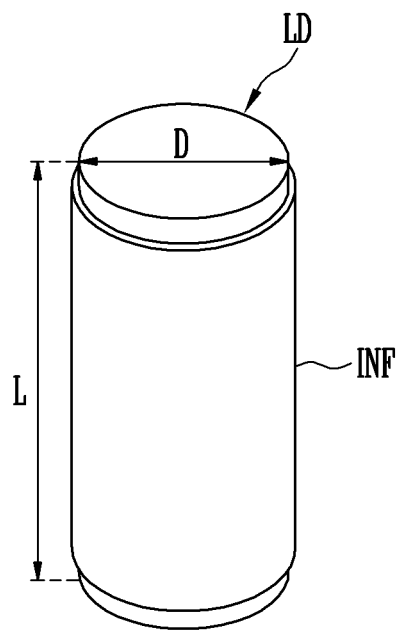
FIGS. 1A and 1B are a schematic perspective diagram and a schematic cross-sectional diagram, respectively, illustrating a light emitting diode in accordance with an embodiment.

Reference will now be made in detail to various embodiments of the disclosure, specific examples of which are illustrated in the accompanying drawings and described below, since the embodiments of the disclosure can be variously modified in many different forms. However, the disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to designate the same or similar elements throughout the drawings, and repetitive explanation will be omitted.

It will be understood that, although the terms "first," "second," and the like may be used herein to describe various elements, these elements should not be limited by these terms. It will be further understood that the terms "comprise," "include," "have," etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be directly on the second part or a third part may intervene between them. Furthermore, the term "position," "direction," etc. used in the following description are defined in relative terms, and it should be noted that they may be changed into a reverse position or direction depending on a view angle or direction.

Embodiments and required details of the disclosure are described with reference to the accompanying drawings in order to describe the disclosure in detail so that those of ordinary skill in the art to which the disclosure pertains can easily practice the disclosure. Furthermore, a singular form may include a plural form as long as it is not specifically mentioned in a sentence. In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIGS. 1A, 1B, 2A, 2B, 3A, and 3B are schematic perspective diagrams and cross-sectional diagrams illustrating light emitting diodes LD in accordance with embodiments of the disclosure. Although FIGS. 1A to 3B illustrate cylindrical rod-type light emitting diodes LD, the kind and/or shape of the light emitting diode LD in accordance with the disclosure is not limited thereto.

Figure 1B:
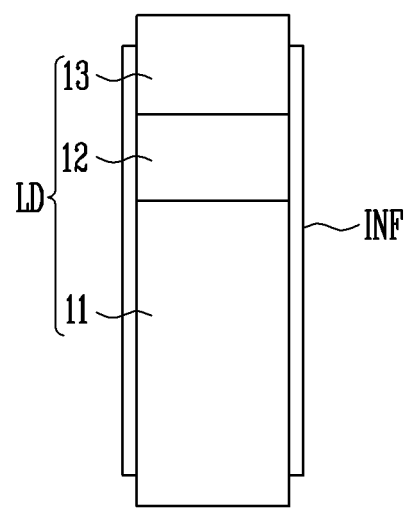

Referring first to FIGS. 1A and 1B, the light emitting diode LD in accordance with an embodiment may include a first conductive semiconductor layer (or a first semiconductor layer) 11, a second conductive semiconductor layer (or a second semiconductor layer) 13, and an active layer 12 interposed between the first and second conductive semiconductor layers 11 and 13. For example, the light emitting diode LD may include or be configured of or formed of a stacked body formed by successively stacking the first conductive semiconductor layer 11, the active layer 12, and the second conductive semiconductor layer 13.

In an embodiment, the light emitting diode LD may be provided in the form of a rod extending in a direction. If the direction in which the light emitting diode LD extends is defined as a longitudinal direction (L), the light emitting diode LD may have a first end and a second end in the longitudinal direction (L).

In an embodiment, one of the first and second conductive semiconductor layers 11 and 13 may be disposed on the first end of the light emitting diode LD, and the other of the first and second conductive semiconductor layers 11 and 13 may be disposed on the second end of the light emitting diode LD.

In an embodiment, the light emitting diode LD may be fabricated in the form of a rod. In this specification, the term "rod-type" shape may refer to a rod-like shape and a bar-like shape such as a cylindrical shape and a prismatic shape extending in the longitudinal direction (e.g., having an aspect ratio greater than 1), and the cross-sectional shape thereof is not limited to a particular shape. For example, a length L of the light emitting diode LD may be greater than a diameter D thereof (or a width of the cross-section thereof).

In an embodiment, the light emitting diode LD may have a small size to a degree of nanoscale to microscale, e.g., a diameter D and/or a length L in a microscale or nanoscale range. However, in the disclosure, the size of the light emitting diode LD is not limited thereto. For example, the size of the light emitting diode LD may be changed in various ways depending on design conditions of various devices, e.g., a display device, which employs as a light source a light emitting device using the light emitting diode LD.

The first conductive semiconductor layer 11 may include, for example, at least one n-type semiconductor layer. For instance, the first conductive semiconductor layer 11 may include an n-type semiconductor layer which includes at least one semiconductor material of InAlGaN, GaN, AlGaN, InGaN, AlN, and InN and is doped with a first conductive dopant such as Si, Ge, or Sn. However, the material forming the first conductive semiconductor layer 11 is not limited thereto, and the first conductive semiconductor layer 11 may be formed of various other materials.

The active layer 12 may be disposed on the first conductive semiconductor layer 11 and have a single or multiple quantum well structure. In an embodiment, a cladding layer (not illustrated) doped with a conductive dopant may be formed on and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field of a voltage equal to or greater than a predetermined voltage is applied to ends of the light emitting diode LD, the light emitting diode LD emits light by coupling of electron-hole pairs in the active layer 12. By controlling light emission of the light emitting diode LD based on these principles, the light emitting diode LD may be used as a light source of various light emitting devices as well as a pixel.

The second conductive semiconductor layer 13 may be disposed on the active layer 12 and may include a semiconductor layer of a type different from that of the first conductive semiconductor layer 11. For example, the second conductive semiconductor layer 13 may include at least one p-type semiconductor layer. For instance, the second conductive semiconductor layer 13 may include a p-type semiconductor layer which includes at least one semiconductor material of InAlGaN, GaN, AlGaN, InGaN, AlN, and InN and is doped with a second conductive dopant such as Mg. However, the material forming the second conductive semiconductor layer 13 is not limited thereto, and the second conductive semiconductor layer 13 may be formed of various other materials.

In an embodiment, an insulating film INF may be provided on an outer circumferential surface of the light emitting diode LD (e.g., an outer surface of a cylinder). For instance, the insulating film INF may be formed on the surface of the light emitting diode LD to enclose an outer circumferential surface of at least the active layer 12. The insulating film INF may further enclose at least a portion of each of the first and second conductive semiconductor layers 11 and 13. Here, the insulating film INF may allow the ends of the light emitting diode LD having different polarities to be exposed to the outside. For example, the insulating film INF may expose an end of each of the first and second conductive semiconductor layers 11 and 13 that are disposed on the respective ends of the light emitting diode LD in the longitudinal direction (L), or for example may expose each of the top and bottom surfaces of the cylinder rather than covering or overlapping it.

In an embodiment, the insulating film INF may include at least one insulating material of $SiO_2$, $Si_3N_4$, $Al_2O_3$, and $TiO_2$ but is not limited thereto. For example, the material forming the insulating film INF is not limited to a particular material, and the insulating film INF may be formed of known various insulating materials.

In an embodiment, the light emitting diode LD may further include additional components in addition to the first conductive semiconductor layer 11, the active layer 12, and the second conductive semiconductor layer 13. For example, the light emitting diode LD may further include at least one fluorescent layer, at least one active layer, at least one semiconductor layer and/or at least one electrode layer disposed on an end of the first conductive semiconductor layer 11, the active layer 12, and/or the second conductive semiconductor layer 13.

Figure 2A:
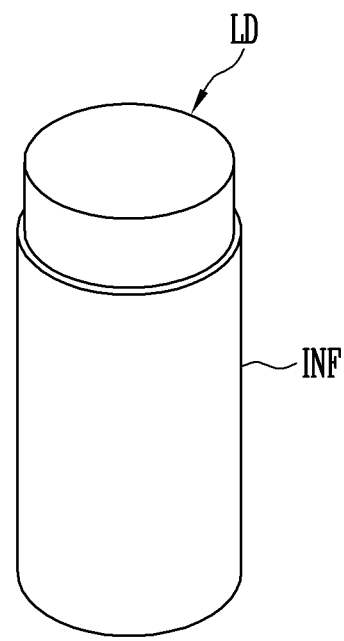
FIGS. 2A and 2B are a schematic perspective diagram and a schematic cross-sectional diagram, respectively, illustrating a light emitting diode in accordance with an embodiment.
Figure 2B:
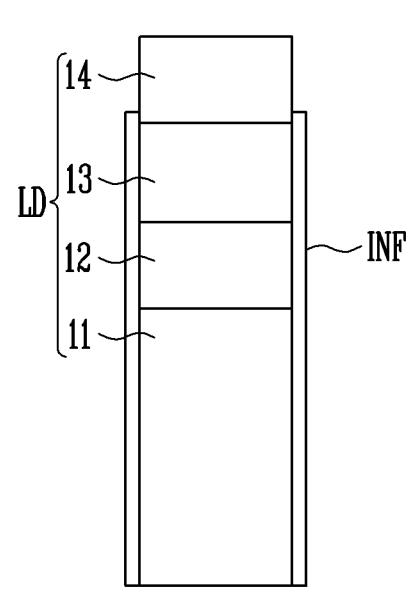

For example, as illustrated in FIGS. 2A and 2B, the light emitting diode LD may further include at least one electrode layer 14 disposed on an end of the second conductive semiconductor layer 13. In an embodiment, as illustrated in FIGS. 3A and 3B, the light emitting diode LD may further include at least one electrode layer 15 disposed on an end of the first conductive semiconductor layer 11.

Each of the electrode layers 14 and 15 may be an ohmic contact electrode, but it is not limited thereto. Furthermore, each of the electrode layers 14 and 15 may include metal or a metal oxide. For example, Cr, Ti, Al, Au, Ni, ITO, IZO, ITZO, and an oxide or alloy thereof may be used alone or in combination. In an embodiment, the electrode layers 14 and 15 may be substantially transparent or translucent. Therefore, light generated from the light emitting diode LD may be emitted out of the light emitting diode LD after passing through the electrode layers 14 and 15.

In an embodiment, the insulating film INF may or may not enclose outer circumferential surfaces of the electrode layers 14 and 15. For example, the insulating film INF may be selectively formed on the surfaces of the electrode layers 14 and 15. Furthermore, the insulating film INF may be formed to allow the ends of the light emitting diode LD having different polarities to be exposed, for example, to allow at least a portion of each of the electrode layers 14 and 15 to be exposed. For example, in another embodiment, the insulating film INF may not be provided.

If the insulating film INF is provided on the surface of the light emitting diode LD, for example, on the surface of the active layer 12, the active layer 12 may be prevented from short-circuiting with at least one electrode (not illustrated), or the like, e.g., at least one electrode of electrodes electrically connected to the ends of the light emitting diode LD. Therefore, the electrical stability of the light emitting diode LD may be ensured.

Furthermore, the formation of the insulating film INF on the surface of the light emitting diode LD may minimize a defect in the surface of the light emitting diode LD, whereby the lifetime and efficiency of the light emitting diode LD may be improved. If the insulating film INF is formed on each light emitting diode LD, even in case that light emitting diodes LD are disposed adjacent to each other, the light emitting diodes LD may be prevented from undesirably short-circuiting.

In an embodiment of the disclosure, the light emitting diode LD may be fabricated by an additional surface treatment process. For example, the light emitting diode LD may be surface-treated (e.g., by a coating process) so that, in case that the light emitting diodes LD are mixed with a fluidic solution and then supplied to each light emission area (e.g., each pixel area or unit light emission area), the light emitting diodes LD can be evenly distributed rather than unevenly aggregating in the solution.

A light emitting device including the above-described light emitting diode LD may be used as a light source in various devices including a display device. For example, at least one light emitting diode LD may be disposed in each pixel area of a light emitting display panel, thereby forming a light emission unit of each pixel. Furthermore, the field of application of the light emitting diode LD according to the disclosure is not limited to a display device. For example, the light emitting diode LD may also be used in various devices, such as a lighting device, which requires a light source.

Figure 4:
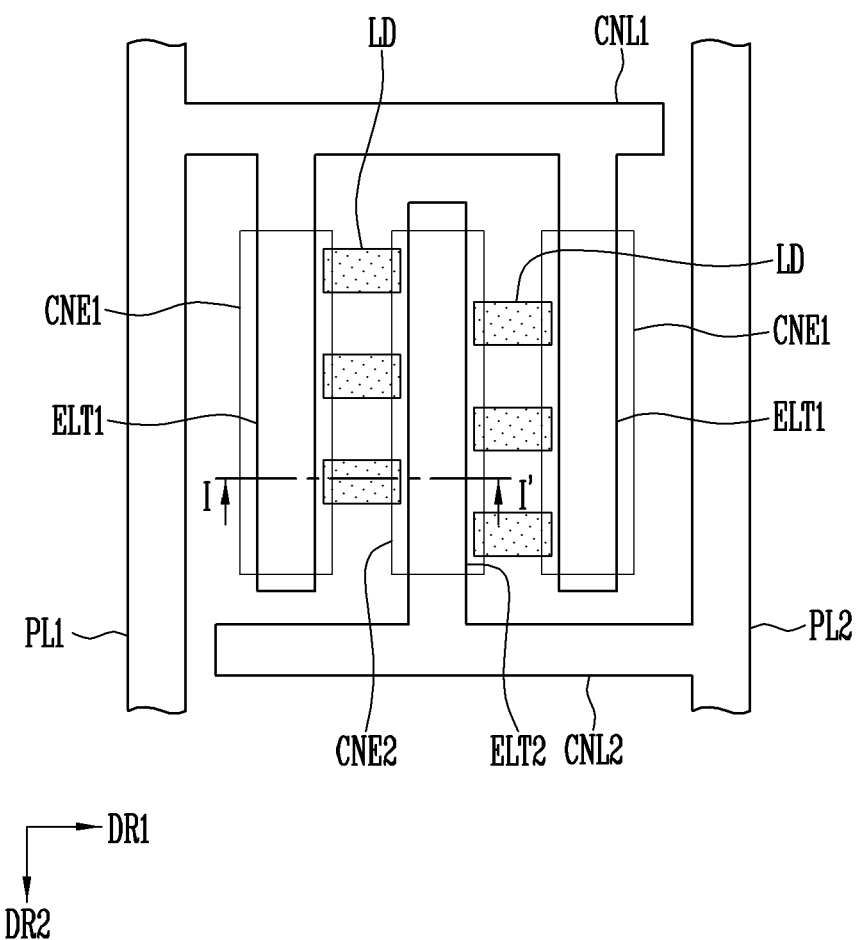
FIG. 4 is a schematic plan diagram illustrating a light emitting device in accordance with an embodiment.

FIG. 4 is a plan diagram illustrating a light emitting device in accordance with an embodiment of the disclosure. In an embodiment, FIG. 4 illustrates a light emitting device which includes first and second power lines PL1 and PL2 or is directly and electrically connected to the first and second power lines PL1 and PL2. However, the light emitting device according to the disclosure is not limited to the embodiment illustrated in FIG. 4. For example, in another embodiment, the light emitting device may be electrically connected to the first and/or second power line PL1 and/or PL2 via at least one circuit element (e.g., a pixel circuit), an intermediate connection line, or the like.

Referring to FIG. 4, the light emitting device in accordance with an embodiment may include a first electrode ELT1, a second electrode ELT2, light emitting diodes LD disposed between the first and second electrodes ELT1 and ELT2, and first and second contact electrodes CNE1 and CNE2 electrically connecting the light emitting diodes LD and the first and second electrodes ELT1 and ELT2 to each other. However, the light emitting device according to the disclosure is not limited to the embodiment illustrated in FIG. 4. For example, each light emitting device may include only a single light emitting diode LD.

The light emitting device may further include a first connection electrode CNL1 electrically connecting the first electrode ELT1 to the first power line PL1, and a second connection electrode CNL2 electrically connecting the second electrode ELT2 to the second power line PL2. In an embodiment, the first and second connection electrodes CNL1 and CNL2 may be integrally connected to the first and second electrodes ELT1 and ELT2, respectively, or electrically connected to the first and second electrodes ELT1 and ELT2, respectively, via at least one contact hole or the like. For example, the first and second connection electrodes CNL1 and CNL2 and the first and second electrodes ELT1 and ELT2 may be integral with each other. In case that the first and second connection electrodes CNL1 and CNL2 are integrally connected to the first and second electrodes ELT1 and ELT2, respectively, each of the first and second connection electrodes CNL1 and CNL2 may be a portion of a corresponding electrode of the first and second electrodes ELT1 and ELT2.

The first electrode ELT1 and the second electrode ELT2 may be spaced apart from each other and disposed such that at least portions thereof face each other. For example, the first and second electrodes ELT1 and ELT2 may be spaced apart from each other by a predetermined distance and disposed parallel to each other on a substrate, which is a base component of the light emitting device, on the same layer and/or at the same height. However, the disclosure is not limited thereto. For example, the shapes and/or arrangement of the first and second electrodes ELT1 and ELT2 may be changed in various ways.

In an embodiment, the first electrode ELT1 may be electrically connected to the first power line PL1 through the first connection electrode CNL1. In an embodiment, the first electrode ELT1 and the first connection electrode CNL1 may extend in different directions. For example, in case that the first connection electrode CNL1 extends in a first direction DR1 (e.g., in a lateral direction), the first electrode ELT1 may extend in a second direction DR2 (e.g., in a longitudinal direction) intersecting the first direction DR1.

In an embodiment, the first electrode ELT1 may be integrally connected with the first connection electrode CNL1. For example, the first electrode ELT1 and the first connection electrode CNL1 may be integral with each other. For instance, the first electrode ELT1 may branch from the first connection electrode CNL1. However, the disclosure is not limited thereto. For example, in an embodiment, the first electrode ELT1 and the first connection electrode CNL1 may be individually formed and electrically connected to each other through at least one contact hole, at least one via hole, or the like.

In an embodiment, the first electrode ELT1 and/or the first connection electrode CNL1 may be integrally connected with the first power line PL1 (or they may be integral with each other). In an embodiment, the first electrode ELT1 and/or the first connection electrode CNL1 may be formed individually from the first power line PL1 and electrically connected to the first power line PL1 via at least one contact hole and/or at least one circuit element. Hence, first power supply to be supplied to the first power line PL1 may be transmitted to the first electrode ELT1.

In an embodiment, the second electrode ELT2 may be electrically connected to the second power line PL2 through the second connection electrode CNL2. In an embodiment, the second electrode ELT2 and the second connection electrode CNL2 may extend in different directions. For example, in case that the second connection electrode CNL2 extends in the first direction DR1, the second electrode ELT2 may extend in the second direction DR2 intersecting with the first direction DR1.

In an embodiment, the second electrode ELT2 may be integrally connected with the second connection electrode CNL2 (or they may be integral with each other). For instance, the second electrode ELT2 may branch from the second connection electrode CNL2. However, the disclosure is not limited thereto. For example, in an embodiment, the second electrode ELT2 and the second connection electrode CNL2 may be individually formed and electrically connected to each other through at least one contact hole, at least one via hole, or the like.

In an embodiment, the second electrode ELT2 and/or the second connection electrode CNL2 may be integrally connected with the second power line PL2 (or they may be integral with each other). In an embodiment, the second electrode ELT2 and/or the second connection electrode CNL2 may be formed individually from the second power line PL2 and electrically connected to the second power line PL2 via at least one contact hole and/or at least one circuit element. Hence, second power supply to be supplied to the second power line PL2 may be transmitted to the second electrode ELT2.

In an embodiment, the first power supply and the second power supply may have different potentials. For example, a difference in potential between the first power supply and the second power supply may be equal to or greater than a threshold voltage of the light emitting diodes LD. In an embodiment, the first power supply and the second power supply may have potentials enabling at least one light emitting diode LD to be electrically connected in a forward direction between the first and second electrodes ELT1 and ELT2. For example, the voltage between the first power supply and the second power supply may have a voltage enabling at least one light emitting diode LD included in the light emitting device to emit light.

In an embodiment, the light emitting diodes LD may be electrically connected in parallel with each other between the first electrode ELT1 and the second electrode ELT2. For example, the light emitting diodes LD may be arranged in the first direction DR1, e.g., in the lateral direction, between the first and second electrodes ELT1 and ELT2 in an area in which the first electrode ELT1 and the second electrode ELT2 face each other.

In an embodiment, the first end of each of the light emitting diodes LD may be electrically connected to the first electrode ELT1 through a first contact electrode CNE1. The second end of each of the light emitting diodes LD may be electrically connected to the second electrode ELT2 through a second contact electrode CNE2. However, the disclosure is not limited thereto. For example, in an embodiment of the disclosure, at least one of the ends of the light emitting diodes LD may directly contact the first or second electrode ELT1 or ELT2 and thus may be electrically connected to the first or second electrode ELT1 or ELT2.

Although FIG. 4 illustrates that the light emitting diodes LD are uniformly arranged in a direction, e.g., in the first direction DR1, the disclosure is not limited thereto. For example, at least one of the light emitting diodes LD may be arranged in a diagonal direction between the first and second electrodes ELT1 and ELT2.

In an embodiment, each of the light emitting diodes LD may be a light emitting diode which is made of or includes a material having an inorganic crystal structure and has a subminiature size to a degree of nanoscale or microscale. For example, each light emitting diode LD may be a subminiature rod-type light emitting diode which has a diameter D and/or a length L in a range of a nanoscale to a microscale, as illustrated in FIGS. 1A to 3B.

In an embodiment, the light emitting diodes LD may be prepared in a diffused or dispersed form in a predetermined solution and then supplied to a predetermined light emission area defined in the light emitting device by an inkjet process or the like. For example, the light emitting diodes LD may be mixed with a volatile solvent and supplied to each light emission area. Here, if the first power supply and the second power supply apply powers to the first and second electrodes ELT1 and ELT2 through the first and second power lines PL1 and PL2, respectively, an electric field may be formed between the first and second electrodes ELT1 and ELT2, whereby the light emitting diodes LD may be self-aligned between the first and second electrodes ELT1 and ELT2. After the light emitting diodes LD have been aligned, the solvent may be removed by a volatilization process or other processes. In this way, the light emitting diodes LD may be reliably arranged between the first and second electrodes ELT1 and ELT2. Since the first contact electrode CNE1 and the second contact electrode CNE2 are respectively formed on the ends of the light emitting diodes LD, the light emitting diodes LD may be more reliably and electrically connected between the first and second electrodes ELT1 and ELT2.

In an embodiment, the first contact electrode CNE1 may cover or overlap the first ends of the light emitting diodes LD and at least a portion of the first electrode ELT1, such that the first ends of the light emitting diodes LD may be physically and/or electrically connected to the first electrode ELT1. Likewise, the second contact electrode CNE2 may cover or overlap the second ends of the light emitting diodes LD and at least a portion of the second electrode ELT2, such that the second ends of the light emitting diodes LD may be physically and/or electrically connected to the second electrode ELT2.

In case that the first power supply applies power to the first ends of the light emitting diodes LD via the first power line PL1 and the first electrode ELT1 and the second power supply applies power to the second ends of the light emitting diodes LD via the second power line PL2 and the second electrode ELT2, at least one light emitting diode LD connected in the forward direction between the first and second electrodes ELT1 and ELT2 may emit light. Therefore, the light emitting device may emit light.

Figure 5:
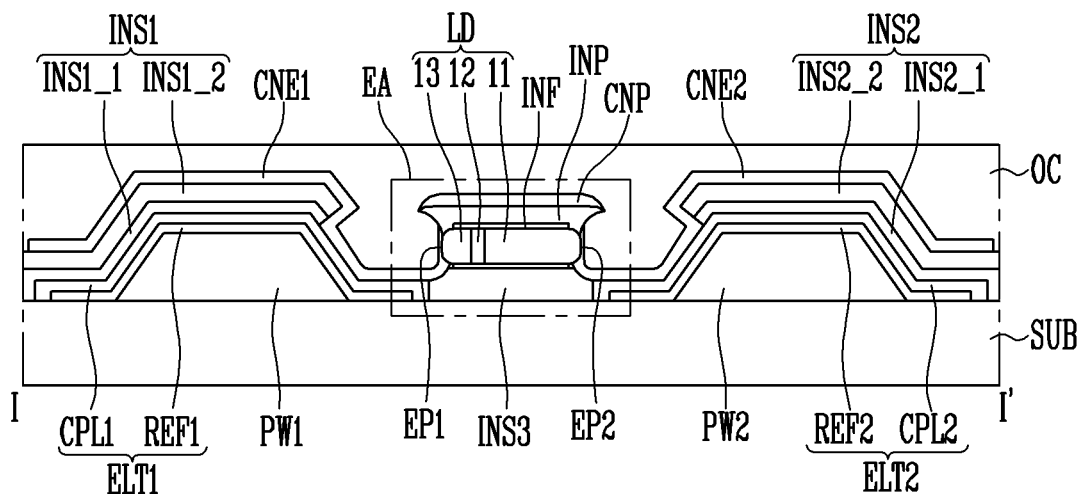
FIGS. 5 and 6 are schematic cross-sectional diagrams taken along line of FIG. 4 to illustrate the structure of the light emitting device.
Figure 6:
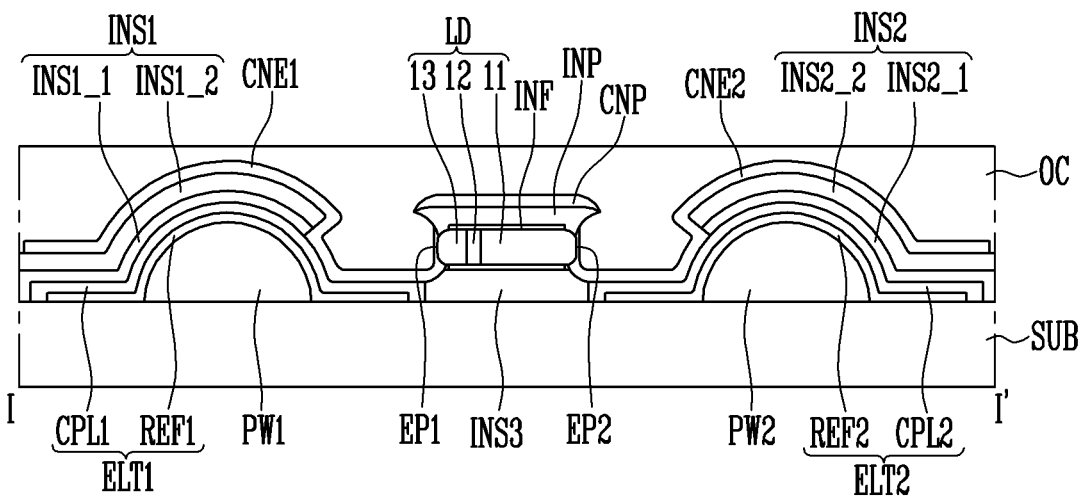

FIGS. 5 and 6 are schematic cross-sectional diagrams taken along line I-I' of FIG. 4 to illustrate the structure of the light emitting device. In detail, FIGS. 5 and 6 illustrate examples of a cross-section taken along line I-I' of FIG. 4 and different embodiments related to the shapes of a first partition wall (e.g., a first wall or a first bank) PW1 and a second partition wall (e.g., a second wall or a second bank) PW2.

Referring to FIGS. 5 and 6 together with FIG. 4, the light emitting device in accordance with an embodiment of the disclosure may include a substrate SUB, a first electrode ELT1 and a second electrode ELT2 disposed on the substrate SUB, at least one light emitting diode LD electrically connected between the first and second electrodes ELT1 and ELT2, and a first contact electrode CNE1 and a second contact electrode CNE2 respectively and electrically connecting the ends of the light emitting diode LD to the first electrode ELT1 and the second electrode ELT2. Furthermore, the light emitting device may further include at least one of the first partition wall PW1 disposed between the substrate SUB and a portion of the first electrode ELT1, the second partition wall PW2 disposed between the substrate SUB and a portion of the second electrode ELT2, at least one first insulating layer INS1 disposed between the first electrode ELT1 and a portion of the first contact electrode CNE1, at least one second insulating layer INS2 disposed between the second electrode ELT2 and a portion of the second contact electrode CNE2, a third insulating layer INS3 disposed between the substrate SUB and the light emitting diode LD, an insulating pattern INP disposed over the light emitting diode LD, and a conductive pattern CNP disposed over the insulating pattern INP.

In an embodiment, the substrate SUB may form a base component of the light emitting device and may be a rigid substrate or a flexible substrate. For example, the substrate SUB may be a rigid substrate made of (or including) glass or reinforced or tempered glass, or a flexible substrate formed of a thin film made of plastic or metal. Furthermore, the substrate SUB may be a transparent substrate, but the disclosure is not limited thereto. For instance, the substrate SUB may be a translucent substrate, an opaque substrate, or a reflective substrate. For example, the material or property of the substrate SUB is not particularly limited.

The first partition wall PW1 and the second partition wall PW2 may be disposed on the substrate SUB. In an embodiment, at least one buffer layer or the like (not illustrated) may be further disposed and/or formed on the substrate SUB. In this case, the first and second partition walls PW1 and PW2 may be disposed on the buffer layer.

The first and second partition walls PW1 and PW2 may be disposed on a surface of the substrate SUB to be spaced apart from each other. For example, the first and second partition walls PW1 and PW2 may be disposed on the same layer (e.g., on the substrate SUB) to be spaced apart from each other by a predetermined distance. In an embodiment, the first and second partition walls PW1 and PW2 may have substantially the same structure, shape, and/or height, but the disclosure is not limited thereto.

In an embodiment, each of the first and second partition walls PW1 and PW2 may include an insulating material having an inorganic material and/or organic material. Furthermore, each of the first and second partition walls PW1 and PW2 may have a single-layer structure or a multi-layer structure. For example, the material and/or stacked structure of each of the first and second partition walls PW1 and PW2 is not particularly limited and may be changed in various ways.

Each of the first and second partition walls PW1 and PW2 may have various shapes. For example, as illustrated in FIG. 5, each of the first and second partition walls PW1 and PW2 may have the cross-sectional shape of a trapezoid, a width of which reduces from a bottom to a top thereof. In an embodiment, as illustrated in FIG. 6, each of the first and second partition walls PW1 and PW2 may have a semicircular or semi-elliptical cross-section, a width of which gradually reduces from a bottom to a top thereof. For example, the shape of each of the first and second partition walls PW1 and PW2 is not particularly limited and may be changed in various ways. In an embodiment, at least one of the first and second partition walls PW1 and PW2 may be omitted or changed in position.

The first electrode ELT1, the first insulating layer INS1, and the first contact electrode CNE1 may be sequentially disposed over or on the first partition wall PW1. The second electrode ELT2, the second insulating layer INS2, and the second contact electrode CNE2 may be sequentially disposed on the second partition wall PW2. At least one electrode and/or insulating layer disposed on each of the first and second partition walls PW1 and PW2 may have a shape corresponding at least to the shape of the corresponding one of the first and second partition walls PW1 and PW2, but the disclosure is not limited thereto.

Furthermore, the third insulating layer INS3, the light emitting diode LD, the insulating pattern INP, and the conductive pattern CNP may be sequentially disposed on the substrate SUB between the first and second electrodes ELT1 and ELT2. In an embodiment, at least a portion of the light emitting diode LD, e.g., a first end EP1 and a second end EP2 of the light emitting diode LD, may face inclined surfaces (or curved surfaces) of the first and second electrodes ELT1 and ELT2 that are formed by the first and second partition walls PW1 and PW2.

The first electrode ELT1 and the second electrode ELT2 may be disposed on the substrate SUB on which the first and second partition walls PW1 and PW2 are disposed and may be spaced apart from each other. For example, the first electrode ELT1 may be disposed on the first partition wall PW1 to cover or overlap the first partition wall PW1. The second electrode ELT2 may be disposed on the second partition wall PW2 to overlap the second partition wall PW2. In an embodiment, one of the first and second electrodes ELT1 and ELT2 may be an anode electrode, and the other may be a cathode electrode.

The first and second electrodes ELT1 and ELT2 may respectively have shapes corresponding at least to those of the first and second partition walls PW1 and PW2. For example, the first electrode ELT1 may have an inclined surface or a curved surface corresponding to the shape of the first partition wall PW1, and the second electrode ELT2 may have an inclined surface or a curved surface corresponding to the shape of the second partition wall PW2. In an embodiment, the first and second partition walls PW1 and PW2 may not be provided in the light emitting device. In this case, the first and second electrodes ELT1 and ELT2 may have a substantially planar shape.

In an embodiment, the first and second electrodes ELT1 and ELT2 may be disposed on the same layer (e.g., on the substrate SUB) and have substantially the same height. As described above, if the first and second electrodes ELT1 and ELT2 have the same height, the light emitting diodes LD may be more reliably and electrically connected between the first and second electrodes ELT1 and ELT2. However, the disclosure is not limited thereto. For example, the shapes, structures, and/or arrangement of the first and second electrodes ELT1 and ELT2 may be changed in various ways.

In an embodiment, each of the first and second electrodes ELT1 and ELT2 may have a single-layer structure or a multi-layer structure, and the stacked structure thereof is not particularly limited. For example, the first electrode ELT1 may have a multi-layer structure including a first reflective electrode REF1 and a first conductive capping layer CPL1. The second electrode ELT2 may have a multi-layer structure including a second reflective electrode REF2 and a second conductive capping layer CPL2.

Each of the first and second reflective electrodes REF1 and REF2 may be formed of a conductive material having a predetermined reflectivity. For example, the first and second reflective electrodes REF1 and REF2 may include at least one of metals such as Ag, Mg, Al, Pt, Pd, Au, Ni, Nd, Ir, Cr, and an alloy thereof. However, the disclosure is not limited thereto. Each of the first and second reflective electrodes REF1 and REF2 may be formed of (or include) various reflective conductive materials.

The first and second reflective electrodes REF1 and REF2 may enable light emitted from the ends, e.g., the first and second ends EP1 and EP2, of each of the light emitting diodes LD to travel in a direction (e.g., in a frontal direction) in which an image is displayed. If each of the first and second reflective electrodes REF1 and REF2 has an inclination or curvature corresponding to the shape of the corresponding one of the first and second partition walls PW1 and PW2, light emitted from the first and second ends EP1 and EP2 of each of the light emitting diodes LD may be reflected by the first and second reflective electrodes REF1 and REF2, whereby the light may travel more reliably in the frontal direction. Therefore, the efficiency of light emitted from the light emitting diodes LD may be enhanced.

In an embodiment of the disclosure, each of the first and second partition walls PW1 and PW2 may also function as a reflective member. For example, the first and second partition walls PW1 and PW2 may function as reflective components for enhancing the efficiency of light emitted from each of the light emitting diodes LD, along with the first and second reflective electrodes REF1 and REF2 provided on the first and second partition walls PW1 and PW2.

The first and second conductive capping layers CPL1 and CPL2 may be selectively disposed on the first and second reflective electrodes REF1 and REF2, respectively. For example, the first conductive capping layer CPL1 may be disposed on the first reflective electrode REF1 to cover the first reflective electrode REF1. The second conductive capping layer CPL2 may be provided on the second reflective electrode REF2 to cover or overlap the second reflective electrode REF2.

Each of the first and second conductive capping layers CPL1 and CPL2 may be formed of a transparent conductive material such as ITO or IZO to minimize loss of light emitted from the light emitting diode LD. However, the disclosure is not limited thereto. For example, the material of each of the first and second conductive capping layers CPL1 and CPL2 may be changed in various ways.

The first and second conductive capping layers CPL1 and CPL2 may prevent the first and second reflective electrodes REF1 and REF2 from being damaged by defects which may occur during a process of fabricating the light emitting device, and the first and second conductive capping layers CPL1 and CPL2 may reinforce the adhesion between the substrate SUB and the first and second reflective electrodes REF1 and REF2. In an embodiment, at least one of the first and second conductive capping layers CPL1 and CPL2 may be omitted.

A 1_1-th insulating layer INS1_1 that forms a lower layer of the first insulating layer INS1, a 2_1-th insulating layer INS2_1 that forms a lower layer of the second insulating layer INS2, and a third insulating layer INS3 that is disposed between the first and second electrodes ELT1 and ELT2 may be disposed on the substrate SUB on which the first and second electrodes ELT1 and ELT2 are disposed.

In an embodiment, the 1_1-th insulating layer INS1_1 may be disposed between the first electrode ELT1 and the first contact electrode CNE1. For example, the 1_1-th insulating layer INS1_1 may be disposed between the first conductive capping layer CPL1 and a portion of the first contact electrode CNE1. The 1_1-th insulating layer INS1_1 may expose an upper surface of a portion of the first electrode ELT1 and may be disposed on another portion of the first electrode ELT1. For example, the 1_1-th insulating layer INS1_1 may expose a portion of the first conductive capping layer CPL1 adjacent to the first end EP1 of the light emitting diode LD and may cover or overlap the another portion of the first conductive capping layer CPL1.

In an embodiment, the 2_1-th insulating layer INS2_1 may be disposed between the second electrode ELT2 and the second contact electrode CNE2. For example, the 2_1-th insulating layer INS2_1 may be disposed between the second conductive capping layer CPL2 and a portion of the second contact electrode CNE2. The 2_1-th insulating layer INS2_1 may expose an upper surface of a portion of the second electrode ELT2 and may be disposed on another portion of the second electrode ELT2. For example, the 2_1-th insulating layer INS2_1 may expose a portion of the second conductive capping layer CPL2 adjacent to the second end EP2 of the light emitting diode LD and may cover or overlap the another portion of the second conductive capping layer CPL2.

In an embodiment, the third insulating layer INS3 may be disposed between the first electrode ELT1 and the second electrode ELT2 in a plan view (e.g., when viewed from above the substrate SUB), and may be disposed between the substrate SUB and the light emitting diode LD in a thickness direction (e.g., a thickness direction of the substrate SUB). The light emitting diode LD may be disposed on the third insulating layer INS3. For example, the third insulating layer INS3 may be an insulating layer disposed under the light emitting diode LD. The third insulating layer INS3 may stably support the light emitting diode LD and may prevent the light emitting diode LD from being removed.

In an embodiment, the 1_1-th insulating layer INS1_1, the 2_1-th insulating layer INS2_1, and/or the third insulating layer INS3 may be simultaneously formed. For example, the 1_1-th insulating layer INS1_1, the 2_1-th insulating layer INS2_1, and/or the third insulating layer INS3 may include the same insulating material of various insulating materials including SiNx and may be simultaneously formed at the same processing step. However, the disclosure is not limited thereto. For example, in an embodiment, the 1_1-th insulating layer INS1_1, the 2_1-th insulating layer INS2_1, and/or the third insulating layer INS3 may include at least one different insulating materials or may be formed in different processing steps. Each of the 1_1-th insulating layer INS1_1, the 2_1-th insulating layer INS2_1, and/or the third insulating layer INS3 may be formed as a single layer or multiple layers, and the structure thereof is not particularly limited. For example, in the disclosure, the structure, material, and/or formation sequence of the 1_1-th insulating layer INS1_1, the 2_1-th insulating layer INS2_1, and/or the third insulating layer INS3 are not particularly limited.

In an embodiment, at least one light emitting diode LD may be disposed on the substrate SUB on which the 1_1-th insulating layer INS1_1, the 2_1-th insulating layer INS2_1, and/or the third insulating layer INS3 are disposed. The light emitting diode LD may be disposed over or over the third insulating layer INS3 and may be disposed between the first electrode ELT1 and the second electrode ELT2 in a plan view. The light emitting diode LD may include a first end EP1 and a second end EP2 on sides thereof in the longitudinal direction.

In an embodiment, the light emitting diode LD may be horizontally disposed on a surface of the substrate SUB. Furthermore, the light emitting diode LD may be arranged in a lateral direction between the first electrode ELT1 and the second electrode ELT2. For example, the first end EP1 of the light emitting diode LD may face the first electrode ELT1. The second end EP2 of the light emitting diode LD may face the second electrode ELT2.

A 1_2-th insulating layer INS1_2 that forms an upper layer of the first insulating layer INS1, a 2_2-th insulating layer INS2_2 that forms an upper layer of the second insulating layer INS2, and the insulating pattern INP disposed on the light emitting diode LD may be disposed on the substrate SUB on which the light emitting diode LD is disposed.

In an embodiment, the 1_2-th insulating layer INS1_2 may be disposed between the first electrode ELT1 and the first contact electrode CNE1 along with the 1_1-th insulating layer INS1_1. For example, the 1_2-th insulating layer INS1_2 may be disposed on the 1_1-th insulating layer INS1_1. The 1_2-th insulating layer INS1_2 may expose an upper surface of a portion of the first electrode ELT1, along with the 1_1-th insulating layer INS1_1 and may be disposed on another portion of the first electrode ELT1. For example, the 1_2-th insulating layer INS1_2 may expose a portion of the first conductive capping layer CPL1 adjacent to the first end EP1 of the light emitting diode LD and may cover or overlap another portion of the first conductive capping layer CPL1.

In an embodiment, the 2_2-th insulating layer INS2_2 may be disposed between the second electrode ELT2 and the second contact electrode CNE2 along with the 2_1-th insulating layer INS2_1. For example, the 2_2-th insulating layer INS2_2 may be disposed on the 2_1-th insulating layer INS2_1. The 2_2-th insulating layer INS2_2 may allow an upper surface of a portion of the second electrode ELT2 to be exposed, along with the 2_1-th insulating layer INS2_1 and may be disposed on another portion of the second electrode ELT2. For example, the 2_2-th insulating layer INS2_2 may expose a portion of the second conductive capping layer CPL2 adjacent to the second end EP2 of the light emitting diode LD and may cover or overlap another portion of the second conductive capping layer CPL2.

In an embodiment, the insulating pattern INP may cover or overlap the upper portion of the light emitting diode LD and may be formed such that the first and second ends EP1 and EP2 provided on the sides of the light emitting diode LD are exposed. For example, in a plan view, the insulating pattern INP may completely overlap the first and second ends EP1 and EP2 of the light emitting diode LD. In a side view or a cross-sectional view, the insulating pattern INP may not cover or overlap at least a portion of each of the first and second ends EP1 and EP2.

In an embodiment, the insulating pattern INP may be formed such that during a process of forming a conductive layer to form the first and second contact electrodes CNE1 and CNE2, the conductive layer can be disconnected (e.g., cut off) by the insulating pattern INP on the first and second ends EP1 and EP2 of the light emitting diode LD. For example, the insulating pattern INP may have a shape and/or size capable of disconnecting the conductive layer in areas over the first and second ends EP1 and EP2 of the light emitting diode LD. The structure and/or shape of the insulating pattern INP will be described below in more detail.

In an embodiment, the 1_2-th insulating layer INS1_2, the 2_2-th insulating layer INS2_2, and/or the insulating pattern INP may be simultaneously formed. For example, the 1_2-th insulating layer INS1_2, the 2_2-th insulating layer INS2_2, and/or the insulating pattern INP may include the same insulating material of various insulating materials including SiNx and may be simultaneously formed in the same processing step. However, the disclosure is not limited thereto. For example, in an embodiment, the 1_2-th insulating layer INS1_2, the 2_2-th insulating layer INS2_2, and/or the insulating pattern INP may include at least one different insulating materials or may be formed at different processing steps. The 1_2-th insulating layer INS1_2, the 2_2-th insulating layer INS2_2, and/or the insulating pattern INP and the 1_1-th insulating layer INS1_1, the 2_1-th insulating layer INS2_1, and/or the third insulating layer INS3 may have the same insulating material. For example, the 1_1-th insulating layer INS1_1, the 2_1-th insulating layer INS2_1, the third insulating layer INS3, the 1_2-th insulating layer INS1_2, the 2_2-th insulating layer INS2_2, and the insulating pattern INP may include or be formed of SiNx. However, the disclosure is not limited thereto, and the material of the above insulating layers may be changed in various ways.

In an embodiment, each of the 1_2-th insulating layer INS1_2, the 2_2-th insulating layer INS2_2, and the insulating pattern INP may be formed of a single layer or multiple layers, and the structure thereof is not particularly limited. For example, in the disclosure, the structure, material, and/or formation sequence of the 1_2-th insulating layer INS1_2, the 2_2-th insulating layer INS2_2, and/or the insulating pattern INP are not particularly limited.

Furthermore, the first insulating layer INS1 and the second insulating layer INS2 may have substantially identical or similar material and/or structure and may be formed by the same process or method. For example, at least one of the material, stacked structure, shape, thickness, and height of the first insulating layer INS1 and the second insulating layer INS2 may be the same.

Each of the third insulating layer INS3 and the insulating pattern INP may be formed simultaneously with the first and second insulating layers INS1 and INS2 during a process of forming portions of the first and second insulating layers INS1 and INS2. For example, the third insulating layer INS3 may have a material and/or structure substantially identical or similar to that of the 1_1-th and 2_1-th insulating layers INS1_1 and INS2_1 that respectively form lower layers of the first and second insulating layers INS1 and INS2 and may have a thickness substantially equal and/or similar to that of the 1_1-th and 2_1-th insulating layers INS1_1 and INS2_1. The third insulating layer INS3 may have a thickness less than the entire thickness of each of the first and second insulating layers INS1 and INS2. For example, the third insulating layer INS3 may have a thickness corresponding to approximately a half of the thickness of the first or second insulating layer INS1 or INS2.

Likewise, the insulating pattern INP may have a material and/or structure substantially identical or similar to that of the 1_2-th and 2_2-th insulating layers INS1_2 and INS2_2 that respectively form upper layers of the first and second insulating layers INS1 and INS2 and may have a thickness substantially equal and/or similar to that of the 1_2-th and 2_2-th insulating layers INS1_2 and INS2_2. The insulating pattern INP may have a thickness less than the entire thickness of each of the first and second insulating layers INS1 and INS2. For example, the insulating pattern INP may have a thickness corresponding to approximately a half of the thickness of the first or second insulating layer INS1 or INS2.

The first contact electrode CNE1, the second contact electrode CNE2, and the conductive pattern CNP may be disposed on the substrate SUB on which the first insulating layer INS1, the second insulating layer INS2, and the insulating pattern INP are disposed. Here, the conductive pattern CNP may be selectively included in the light emitting device. In some embodiments, the conductive pattern CNP may be omitted.

The first contact electrode CNE1 may be provided over or on the first electrode ELT1 and the first insulating layer INS1 and may electrically contact the first electrode ELT1 on the portion of the first electrode ELT1 that is not overlapped or covered by the first insulating layer INS1. Therefore, the first contact electrode CNE1 and the first electrode ELT1 may be electrically connected to each other. Furthermore, an end of the first contact electrode CNE1 may electrically contact the first end EP1 of the light emitting diode LD. The first contact electrode CNE1 may stably support the first end EP1 of the light emitting diode LD and electrically connect the first end EP1 to the first electrode ELT1.

The second contact electrode CNE2 may be provided on the second electrode ELT2 and the second insulating layer INS2 and may electrically contact the second electrode ELT2 on the portion of the second electrode ELT2 that is not covered by the second insulating layer INS2. Therefore, the second contact electrode CNE2 and the second electrode ELT2 may be electrically connected to each other. Furthermore, an end of the second contact electrode CNE2 may electrically contact the second end EP2 of the light emitting diode LD. The second contact electrode CNE2 may stably support the second end EP2 of the light emitting diode LD and electrically connect the second end EP2 to the second electrode ELT2.

In an embodiment, the first and second contact electrodes CNE1 and CNE2 may be substantially transparent or translucent. For example, the first and second contact electrodes CNE1 and CNE2 may be formed of a transparent conductive material including ITO or IZO. The first and second contact electrodes CNE1 and CNE2 may be made of various known transparent conductive materials. Therefore, light generated from the light emitting diode LD may be emitted out of the light emitting diode LD after passing through the first and second contact electrodes CNE1 and CNE2.

In an embodiment, the first and second contact electrodes CNE1 and CNE2 may be respectively provided on the first and second ends EP1 and EP2 of the light emitting diode LD and may electrically contact only side surfaces of the light emitting diode LD but may not be disposed on the upper surface of the light emitting diode LD. For example, an end of each of the first and second contact electrodes CNE1 and CNE2 may not extend to the upper surface of the light emitting diode LD and may contact a lower end of a side surface of the insulating pattern INP.

In an embodiment, the first and second contact electrodes CNE1 and CNE2 may be spaced apart from each other with the light emitting diode LD interposed therebetween and may be disposed on the same layer and/or at the same height on the substrate SUB. For example, the first and second contact electrodes CNE1 and CNE2 may have a shape and/or structure in which the first and second contact electrodes CNE1 and CNE2 are symmetrical to each other with the light emitting diode LD disposed therebetween.

The first and second contact electrodes CNE1 and CNE2 may be simultaneously formed by the same process and may be disconnected around a lower portion of the insulating pattern INP by the insulating pattern INP, a width of which reduces toward a lower end thereof (or toward the bottom surface thereof). Therefore, even in case that the light emitting diode LD has a small length, e.g., in a range of a nanoscale to a microscale, the first and second contact electrodes CNE1 and CNE2 may remain separated from each other with the light emitting diode LD interposed therebetween.

Furthermore, the first and second contact electrodes CNE1 and CNE2 are not disposed on the upper surface of the light emitting diode LD. Therefore, even if the insulating film INF formed on the surface of the light emitting diode LD is damaged during a process of forming and/or disposing the light emitting diode LD or a process of forming the insulating pattern INP, the light emitting diode LD may be prevented from undesirably short-circuiting with the first and/or second contact electrodes CNE1 and/or CNE2 through a damaged portion of the insulating film INF.

Hence, even in case the first and second contact electrodes CNE1 and CNE2 are simultaneously formed by the same process, e.g., a single mask process, short defects may be prevented from being caused by the first and second contact electrodes CNE1 and CNE2, and electrical stability of the light emitting device may be ensured.

In such an embodiment of the disclosure, since the first and second contact electrodes CNE1 and CNE2 may be simultaneously formed by the same process, the number of mask processes to be used to fabricate the light emitting device may be reduced or minimized. Therefore, the light emitting diode LD may be reliably and electrically connected between the first electrode ELT1 and the second electrode ELT2, and the process of fabricating the light emitting device may be simplified. In such an embodiment, the productivity can be enhanced by reducing the cost and/or time required to fabricate the light emitting device, and the structure of the light emitting device may be simplified.

The conductive pattern CNP may be disposed on the insulating pattern INP to overlap the light emitting diode LD and may be separated from the light emitting diode LD and the first and second contact electrodes CNE1 and CNE2 by the insulating pattern INP. In an embodiment, the conductive pattern CNP may be formed simultaneously with the first and second contact electrodes CNE1 and CNE2 during the process of forming the first and second contact electrodes CNE1 and CNE2, and may remain on the insulating pattern INP while being disconnected from the first and second contact electrodes CNE1 and CNE2 by the insulating pattern INP having a shape in which the width thereof reduces toward the lower end (or bottom surface) thereof.

For example, the conductive pattern CNP may be formed of a transparent conductive material identical to that of the first and second contact electrodes CNE1 and CNE2 and may remain electrically isolated on the insulating pattern INP. Furthermore, the conductive pattern CNP may be formed on the insulating pattern INP during a conductive layer deposition process for forming the first and second contact electrodes CNE1 and CNE2, e.g., a conductive layer deposition process using a sputtering method, and may have a thickness substantially equal or similar to that of the first and second contact electrodes CNE1 and CNE2.

However, in the disclosure, the conductive pattern CNP may neither be formed in the light emitting device nor remain therein. For example, in an embodiment, the conductive pattern CNP may not be formed or may be selectively removed after the conductive layer deposition process for forming the first and second contact electrodes CNE1 and CNE2. For example, in an embodiment, a mask may be disposed on the insulating pattern INP to prevent the conductive pattern CNP from being formed. As another example, after the conductive pattern CNP has been formed along with the first and second contact electrodes CNE1 and CNE2 during the process of forming the first and second contact electrodes CNE1 and CNE2, the conductive pattern CNP may be selectively removed.

In an embodiment, an overcoat layer OC may be disposed on the substrate SUB on which the first and second contact electrodes CNE1 and CNE2, etc. are disposed. For example, the overcoat layer OC may cover or overlap the upper surface of the substrate SUB on which the first and second contact electrodes CNE1 and CNE2, etc. are disposed.

Figure 7:
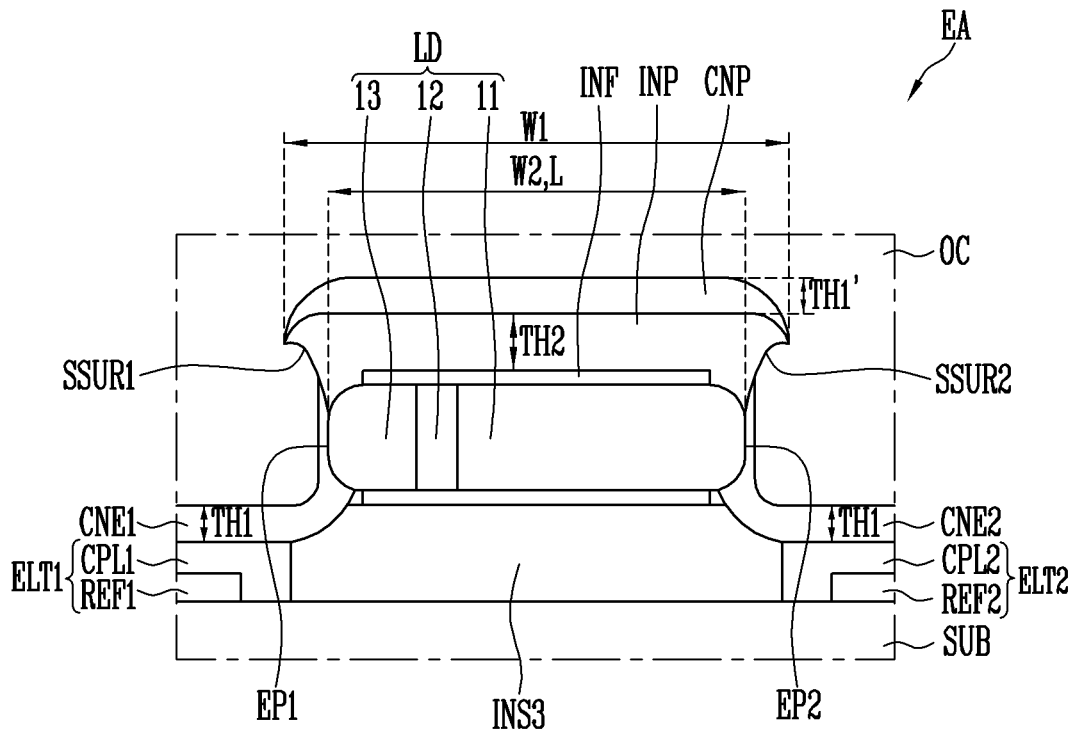
FIG. 7 is a schematic enlarged diagram of area EA of FIG. 5.
Figure 8:
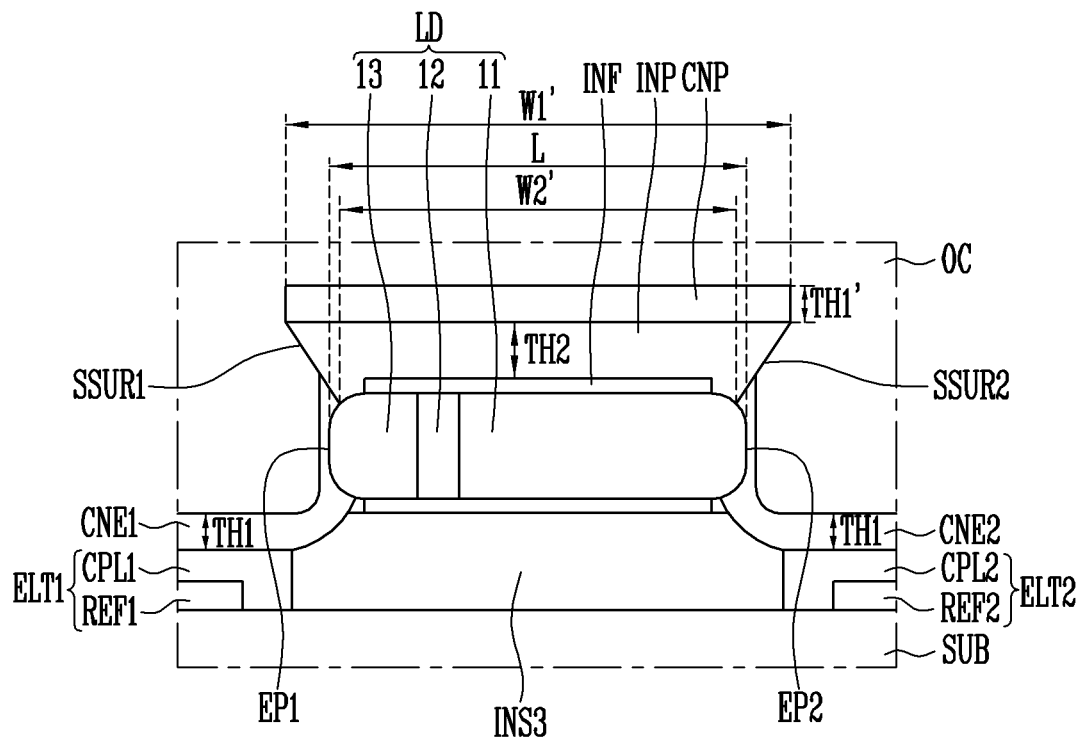
FIG. 8 is a schematic sectional diagram corresponding to area EA of FIG. 5 and illustrates another embodiment related to the shape of an insulating pattern.
Figure 9:
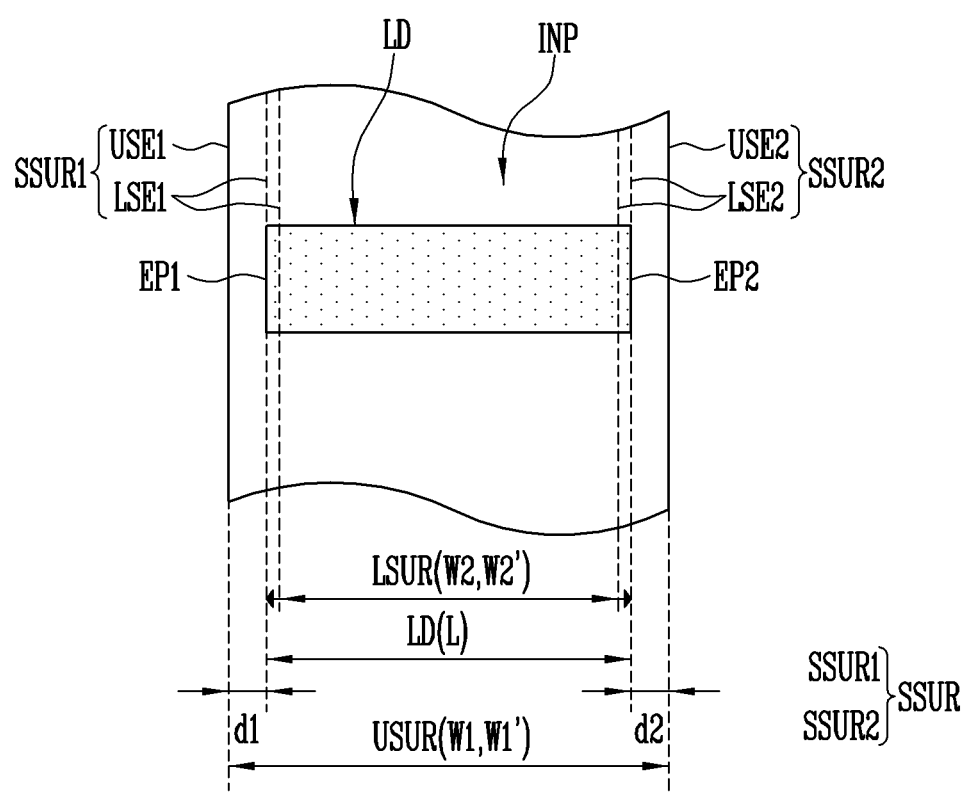
FIG. 9 is a schematic plan diagram schematically illustrating an arrangement of a light emitting diode and an insulating pattern, in accordance with an embodiment.

FIG. 7 is a schematic enlarged diagram of area EA of FIG. 5. FIG. 8 is a schematic cross-sectional diagram corresponding to area EA of FIG. 5, and illustrates another embodiment related to the shape of the insulating pattern INP. FIG. 9 is schematic a plan diagram schematically illustrating the arrangement of the light emitting diode LD and the insulating pattern INP in accordance with an embodiment.

Referring to FIGS. 7 to 9, the insulating pattern INP may completely cover or overlap the entirety of the upper surface of the light emitting diode LD including the first and second ends EP1 and EP2, in a plan view. However, in a side view or cross-sectional view of the substrate SUB, the insulating pattern INP may allow the first and second ends EP1 and EP2 of the light emitting diode LD to be exposed.

For example, the insulating pattern INP may cover or overlap only upper end portions (or upper surface) of the first and second ends EP1 and EP2 without covering the other portions of the first and second ends EP1 and EP2. For example, the insulating pattern INP may completely cover the upper surface of each light emitting diode LD and may have a cross-sectional shape in which the width thereof reduces toward a lower end portion (or bottom surface) thereof adjacent to the substrate SUB or toward the lower end portion close to the substrate SUB, so that the first and second ends EP1 and EP2 disposed on the sides of the light emitting diode LD can be exposed. The first end EP1 not covered by the insulating pattern INP may contact and be covered by the first contact electrode CNE1. The second end EP2 not covered by the insulating pattern INP may contact and be covered by the second contact electrode CNE2. For example, the first and second contact electrodes CNE1 and CNE2 may be disposed on the sides of the light emitting diode LD arranged in the lateral direction and may be electrically connected to the light emitting diode LD by contacting the light emitting diode LD.

In an embodiment, an upper surface USUR of the insulating pattern INP may have a first width W1 or W1' greater than the length L of the light emitting diode LD and may completely cover the upper surface of the light emitting diode LD. The insulating pattern INP may have a shape in which the width thereof reduces toward a lower end area thereof or toward the lower end portion and may allow the first and second ends EP1 and EP2 of the light emitting diode LD to be exposed. For example, a lower surface LSUR of the insulating pattern INP may have a second width W2 or W2' close to or less than the length L of the light emitting diode LD.

For example, the insulating pattern INP may have a cross-sectional shape in which the width thereof gradually reduces toward the lower end portion thereof, on side surfaces SSUR thereof below which the first and second ends EP1 and EP2 of the light emitting diode LD are disposed. In an embodiment, the insulating pattern INP may include a first side surface SSUR1 disposed on the first end EP1 of the light emitting diode LD, and a second side surface SSUR2 disposed on the second end EP2 of the light emitting diode LD. Furthermore, the first and second side surfaces SSUR1 and SSUR2 may have a curved surface (e.g., a curved surface corresponding to a side surface portion of a mushroom shape), as illustrated in FIG. 7, or may have an inclined surface (e.g., an inclined surface corresponding to a side surface portion of a reversed trapezoidal shape), as illustrated in FIG. 8, so that the width therebetween may be gradually reduced toward the lower end portion. However, the shape of the insulating pattern INP is not limited to the embodiments of FIGS. 7 and 8. The shape of the insulating pattern INP may be changed in various ways. For example, in an embodiment, the first and second side surfaces SSUR1 and SSUR2 of the insulating pattern INP may have a combination of a curved surface and an inclined surface, a stepped shape, or an uneven surface shape.

In an embodiment, the insulating pattern INP may have a shape and/or size such that during a process of forming the conductive layer to form the first and second contact electrodes CNE1 and CNE2, the conductive layer may be naturally disconnected by a shadow effect due to the insulating pattern INP in the upper end portions of the first and second ends EP1 and EP2 of the light emitting diode LD. For example, in case that each of the first and second contact electrodes CNE1 and CNE2 has a first thickness TH1 and the conductive pattern CNP has a thickness TH1' equal or close to the first thickness TH1 or less than the first thickness TH1, an upper end USE1 of the first side surface SSUR1 of the insulating pattern INP may be spaced apart from the first end EP1 of the light emitting diode LD by a first distance d1 equal to or greater than the first thickness TH1 in a direction toward the first electrode ELT1, in a plan view. Likewise, an upper end USE2 of the second side surface SSUR2 of the insulating pattern INP may be spaced apart from the second end EP2 of the light emitting diode LD by a second distance d2 equal to or greater than the first thickness TH1 in a direction toward the second electrode ELT2, in the plan view of the substrate SUB. For example, in case that the thickness, e.g., the first thickness TH1, of each of the first and second contact electrodes CNE1 and CNE2 to be formed during a follow-up process, is in a range of about 0.1 μm to about 0.2 μm, the respective upper ends USE1 and USE2 of the first and second side surfaces SSUR1 and SSUR2 of the insulating pattern INP may be respectively disposed at positions spaced apart from the first end EP1 and the second end EP2 of the light emitting diode LD by about 0.3 μm or greater, e.g., about 0.3 μm to about 0.5 μm, in a plan view.

The respective lower ends LSE1 and LSE2 of the first and second side surfaces SSUR1 and SSUR2 may be disposed immediately adjacent to the first and second ends EP1 and EP2. For example, the respective lower ends LSE1 and LSE2 of the first and second side surfaces SSUR1 and SSUR2 may be disposed adjacent to the first and second ends EP1 and EP2 within a distance of the first thickness TH1 or less. Hence, during the process of forming the first and second contact electrodes CNE1 and CNE2, the first and second contact electrodes CNE1 and CNE2 may reliably contact the ends, e.g., the first and second ends EP1 and EP2, of the light emitting diode LD.

Furthermore, the insulating pattern INP may have a thickness enabling the conductive pattern CNP to be reliably separated from the first and second contact electrodes CNE1 and CNE2 and the light emitting diode LD disposed around the conductive pattern CNP. For example, the insulating pattern INP may have a second thickness TH2 equal to or greater than the thickness, e.g., the first thickness TH1, of the first and second contact electrodes CNE1 and CNE2. For instance, in case that the first thickness TH1 is in a range of about 0.1 μm to about 0.2 μm, the second thickness TH2 may be about 0.3 μm or greater, e.g., about 0.3 μm to about 0.5 μm.

The insulating pattern INP may have a shape enabling the conductive layer for forming the first and second contact electrodes CNE1 and CNE2 to be reliably disconnected on the first and second side surfaces SSUR1 and SSUR2. For example, the insulating pattern INP may have an angle, an inclination, and/or a curvature within a predetermined range in a shape in which the width thereof reduces toward the lower end portion thereof. The insulating pattern INP may have a step shape or the like.

In the foregoing embodiment, the insulating pattern INP that overlaps or covers the upper surface of the light emitting diode LD may have a shape in which the width thereof reduces toward the lower end portion thereof. Therefore, the light emitting diode LD may be reliably and electrically connected between the first electrode ELT1 and the second electrode ELT2, and the process of fabricating the light emitting device may be simplified.

FIGS. 10A to 10I are sectional diagrams sequentially illustrating a method of fabricating the light emitting device illustrated in FIG. 5.

Figure 10A:
FIGS. 10A to 10I are schematic cross-sectional diagrams sequentially illustrating a method of fabricating the light emitting device illustrated in FIG. 5.

Referring to FIG. 10A, a first partition wall PW1 and a second partition wall PW2 may be formed on a surface of the substrate SUB to be spaced apart from each other. In an embodiment, the first and second partition walls PW1 and PW2 may be formed by a process of forming an insulating layer including an inorganic material and/or organic material or a patterning process (e.g., a mask process), and may also be formed by any of various types of known processes. In an embodiment, the first and second partition walls PW1 and PW2 may be simultaneously formed on the same layer (or on the same plane) (e.g., on the substrate SUB) by using the same material, but the disclosure is not limited thereto.

Figure 10B:
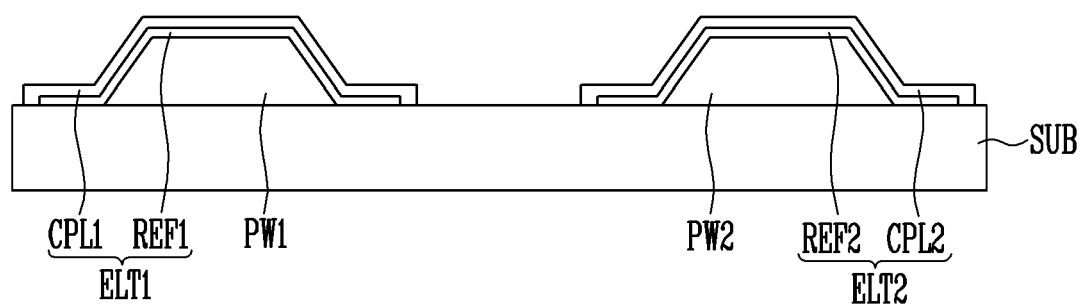

Referring to FIG. 10B, a first electrode ELT1 and a second electrode ELT2 may be formed on the substrate SUB, on which the first and second partition walls PW1 and PW2 are formed, to be spaced apart from each other. In an embodiment, the first and second electrodes ELT1 and ELT2 may be formed through a process of forming a conductive layer including at least one conductive material and/or a patterning process, and may be formed by any of various types of known processes.

In an embodiment, each of the first and second electrodes ELT1 and ELT2 may be formed of a single layer or multiple layers. For example, the first electrode ELT1 may be formed of multiple layers including a first reflective electrode REF1 and a first conductive capping layer CPL1. The second electrode ELT2 may be formed as multiple layers including a second reflective electrode REF2 and a second conductive capping layer CPL2. In this case, a step of forming the first and second electrodes ELT1 and ELT2 may include a step of forming the first and second reflective electrodes REF1 and REF2 respectively on the first and second partition walls PW1 and PW2, and a step of forming the first and second conductive capping layers CPL1 and CPL2 on the first and second reflective electrodes REF1 and REF2.

The first and second electrodes ELT1 and ELT2 may be simultaneously formed on the same layer (e.g., on the substrate SUB), but the disclosure is not limited thereto. In case that the first and second electrodes ELT1 and ELT2 are simultaneously formed, the number of mask processes to be used to fabricate the light emitting device may be reduced or minimized.

Figure 10C:
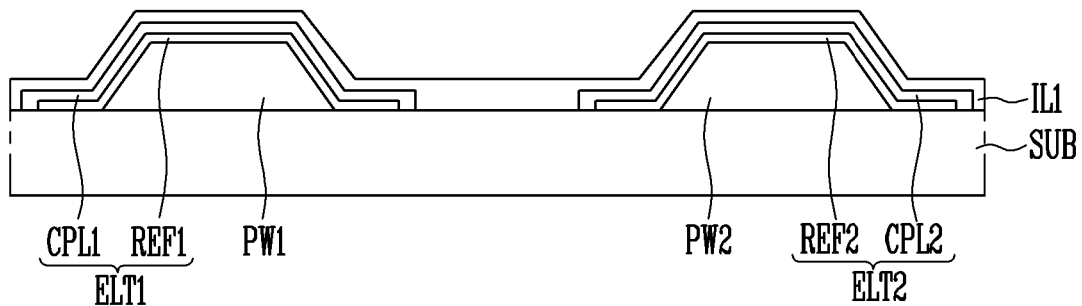

Referring to FIG. 10C, a first insulating material layer IL1 may be formed on the substrate SUB on which the first and second electrodes ELT1 and ELT2 are formed. In an embodiment, the first insulating material layer IL1 may be formed by a deposition process for an insulating layer including inorganic material and/or organic material and may be formed by any of various types of known processes. In an embodiment, the first insulating material layer IL1 may be formed of a single layer or multiple layers.

Figure 10D:
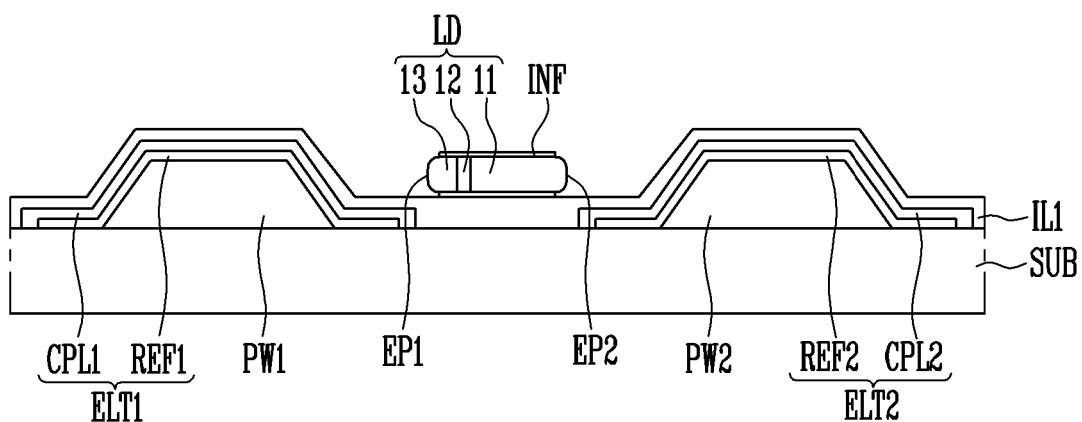

Referring to FIG. 10D, at least one light emitting diode LD may be supplied on the substrate SUB on which the first insulating material layer IL1 is formed. The light emitting diode LD may be disposed between the first and second electrodes ELT1 and ELT2 such that the first end EP1 and the second end EP2 of the light emitting diode LD are respectively adjacent to the first electrode ELT1 and the second electrode ELT2. In an embodiment, the light emitting diode LD may be supplied on the substrate SUB by various methods including an inkjet method and may be aligned between the first and second electrodes ELT1 and ELT2 by applying predetermined voltages to the first and second electrodes ELT1 and ELT2.

Figure 10E:
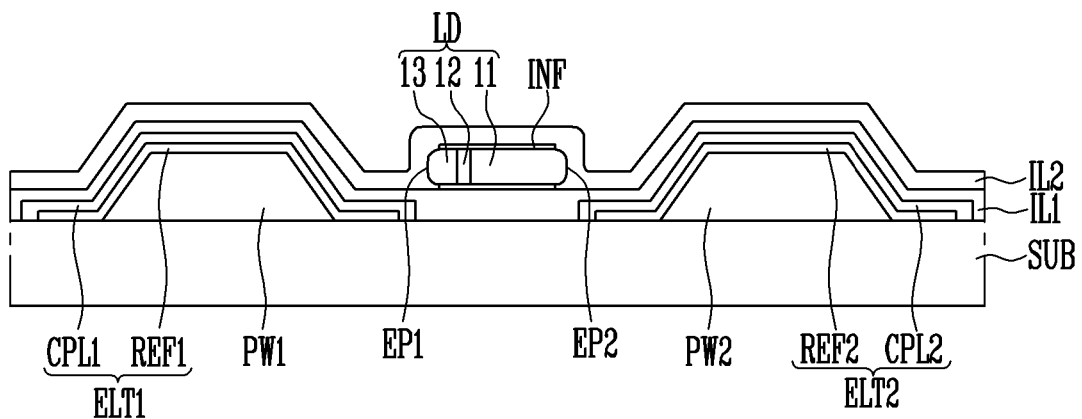

Referring to FIG. 10E, a second insulating material layer IL2 may be formed on the substrate SUB on which the light emitting diode LD is disposed. In an embodiment, the second insulating material layer IL2 may be formed by a deposition process for an insulating layer including an inorganic material and/or organic material and may be formed through any of various types of known processes. In an embodiment, the second insulating material layer IL2 may be formed of a single layer or multiple layers.

Figure 10F:
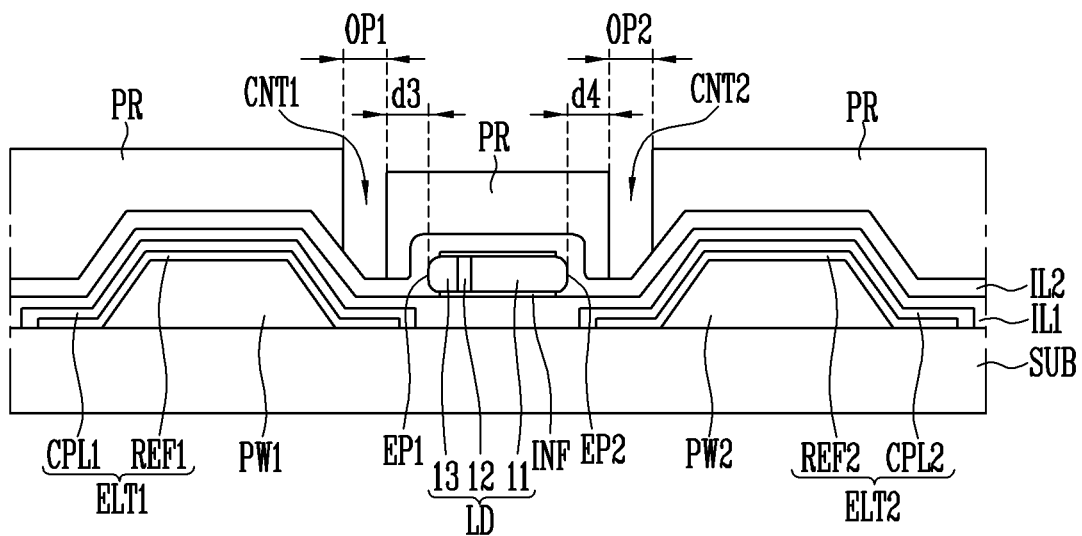
Figure 10G:
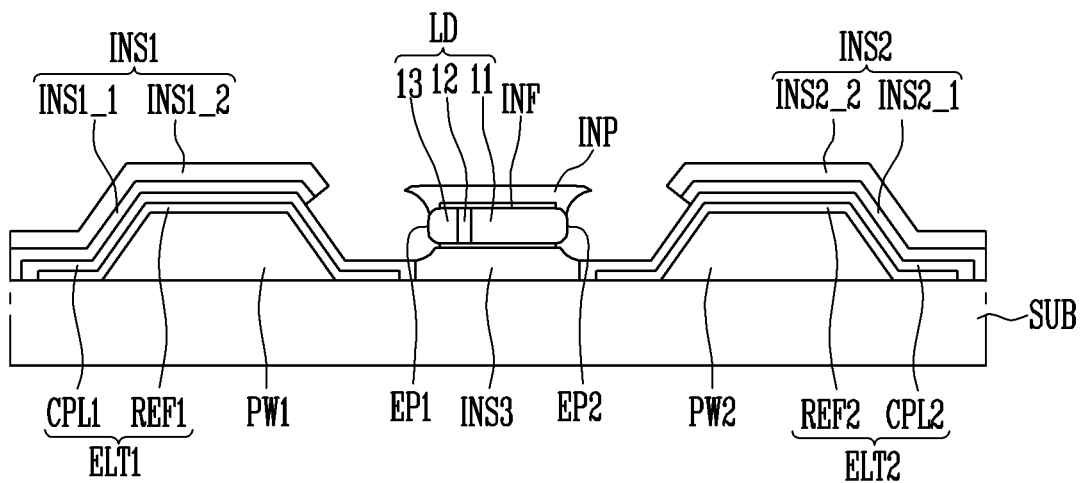

Referring to FIGS. 10F and 10G, a mask (e.g., a photoresist layer PR having openings OP1 and OP2 corresponding to first and second contactors CNT1 and CNT2 for respectively connecting the first and second electrodes ELT1 and ELT2 to the first and second contact electrodes CNE1 and CNE2) may be formed on the substrate SUB on which the second insulating material layer IL2 is formed. The first and second insulating material layers IL1 and IL2 may be etched so that at least portions of the first and second electrodes ELT1 and ELT2 and the first and second ends EP1 and EP2 of the light emitting diode LD may be exposed. Therefore, a first insulating layer INS1 that exposes a portion of the first electrode ELT1 may be formed on the first electrode ELT1, a second insulating layer INS2 that exposes a portion of the second electrode ELT2 may be formed on the second electrode ELT2, and an insulating pattern INP that covers the upper surface of the light emitting diode LD may be formed on the light emitting diode LD.

For example, a step of forming the mask may include a step of forming a photoresist layer PR on the substrate SUB on which the second insulating material layer IL2 is formed, and forming first and second openings OP1 and OP2 in the photoresist layer PR at respective positions corresponding to the first contactor CNT1 and the second contactor CNT2 spaced apart from the first and second ends EP1 and EP2 of the light emitting diode LD by a predetermined third distance d3 and a predetermined fourth distance d4, such that the second insulating material layer IL2 formed on the first and second electrodes ELT1 and ELT2 is partially exposed. As described above, the photoresist layer PR in which the first and second openings OP1 and OP2 are formed may be used as a mask for selectively etching portions of the first and second insulating material layers IL1 and IL2.

In an embodiment, the first and second insulating material layers IL1 and IL2 may be simultaneously etched or sequentially etched. Furthermore, the first and second insulating material layers IL1 and IL2 may be etched at least once and/or by at least one etching process. For example, the first and second insulating material layers IL1 and IL2 may be etched through at least one dry and/or wet etching process.

In an embodiment of the disclosure, at least the second insulating material layer IL2 may be etched (or over-etched) on the sides of the light emitting diode LD on which the first and second ends EP1 and EP2 are disposed, to have a shape in which the width thereof reduces toward a lower end portion thereof. For example, since side surfaces of the second insulating material layer IL2 are over-etched on the light emitting diode LD, the insulating pattern INP may be formed on the light emitting diode LD to completely cover the first and second ends EP1 and EP2 to have the width reduces toward the lower end portion adjacent to the light emitting diode LD, so that the first and second ends EP1 and EP2 may be exposed in the lateral direction of the light emitting diode LD.

In an embodiment, the position and size of each of the first and second openings OP1 and OP2 formed in the photoresist layer PR may be changed depending on etching conditions, a process margin, etc. For example, the position and/or size of the first and second openings OP1 and OP2 may be adjusted, taking into account at least one of the material and thickness of the first and second insulating material layers IL1 and IL2, the concentration of etching gas, a time period during which the etching process is performed, as well as the size, shape, and position of the insulating pattern INP to be formed on the light emitting diode LD. Furthermore, since a portion of the photoresist layer PR may also be etched during the process of etching the first and/or second insulating material layers IL1 and/or IL2, the position and/or size of the first and second openings OP1 and OP2 may be adjusted, taking into account the fact that the first and second openings OP1 and OP2 may be expanded. For example, the position, size, etc. of the first and second openings OP1 and OP2 to be formed in the mask may be set, taking into account process conditions or a margin, or the like.

Figure 10H:
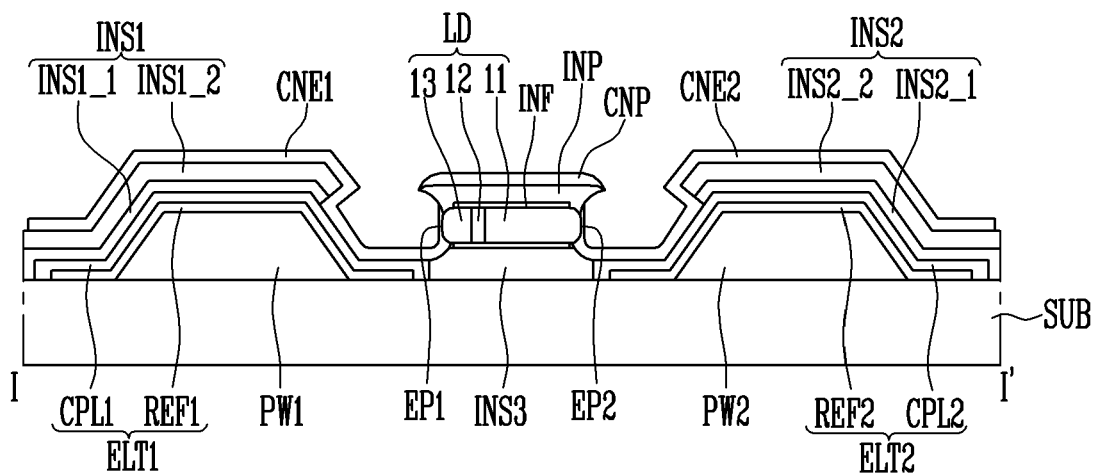

Referring to FIG. 10H, first and second contact electrodes CNE1 and CNE2 and a conductive pattern CNP are formed on the substrate SUB on which the first and second insulating layers INS1 and INS2 and the insulating pattern INP are formed. For example, the first and second contact electrodes CNE1 and CNE2 and the conductive pattern CNP may be formed on the substrate SUB, on which the first and second insulating layers INS1 and INS2 and the insulating pattern INP are formed, by depositing and/or patterning a conductive layer by any of various processes including sputtering.

In an embodiment, the conductive layer may be directly formed not only on the first and second electrodes ELT1 and ELT2 and the light emitting diode LD but also on the first and second ends EP1 and EP2 of the light emitting diode LD that are exposed through the etching process for the first and second insulating material layers IL1 and IL2. Hence, the conductive layer may be formed to contact the first and second ends EP1 and EP2 of the light emitting diode LD, and the first and second contact electrodes CNE1 and CNE2 may be formed to respectively and electrically connect the first and second ends EP1 and EP2 to the first and second electrodes ELT1 and ELT2.

Furthermore, the conductive layer may be formed on the light emitting diode LD and may be separated from the first and second contact electrodes CNE1 and CNE2 by the insulating pattern INP. Therefore, in the step of forming the first and second contact electrodes CNE1 and CNE2, the conductive pattern CNP may be formed on the light emitting diode LD. The conductive pattern CNP may remain separated from the light emitting diode LD and the first and second contact electrodes CNE1 and CNE2 by the insulating pattern INP.

Figure 10I:
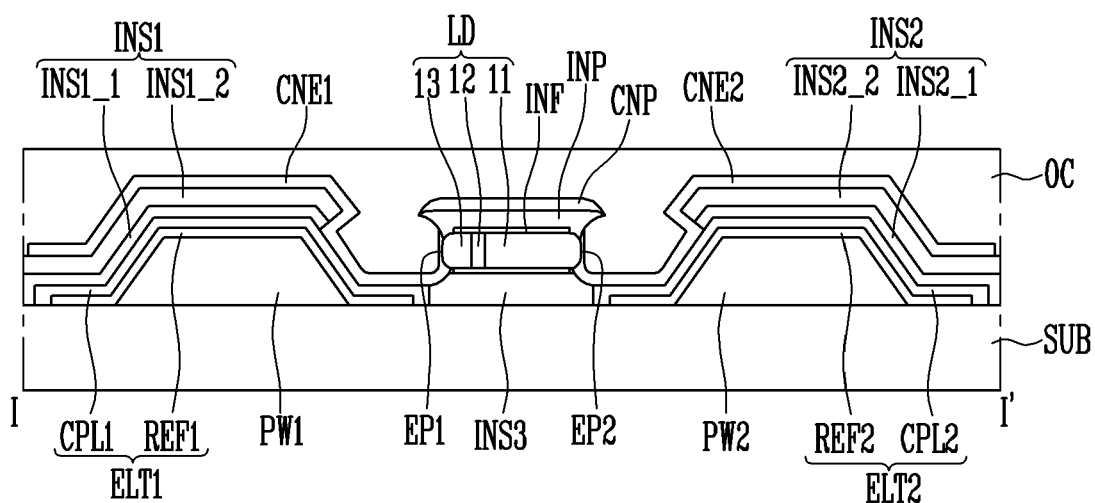

Referring to FIG. 10I, an overcoat layer OC may be formed on the substrate SUB on which the first and second contact electrodes CNE1 and CNE2 and the conductive pattern CNP are formed. As a result, a light emitting device according to the embodiment of FIG. 5 or the like may be fabricated.

In accordance with the foregoing embodiments, the first and second contact electrodes CNE1 and CNE2 may be simultaneously formed on the same layer on the substrate SUB. Therefore, the number of mask processes to be used to fabricate the light emitting device may be reduced or minimized.

Furthermore, since the conductive pattern CNP formed on the light emitting diode LD may remain electrically isolated or disconnected by the insulating pattern INP, short defects may be prevented from occurring in or around the light emitting diode LD, and the light emitting diode LD may be reliably and electrically connected between the first and second electrodes ELT1 and ELT2.

Figure 11:
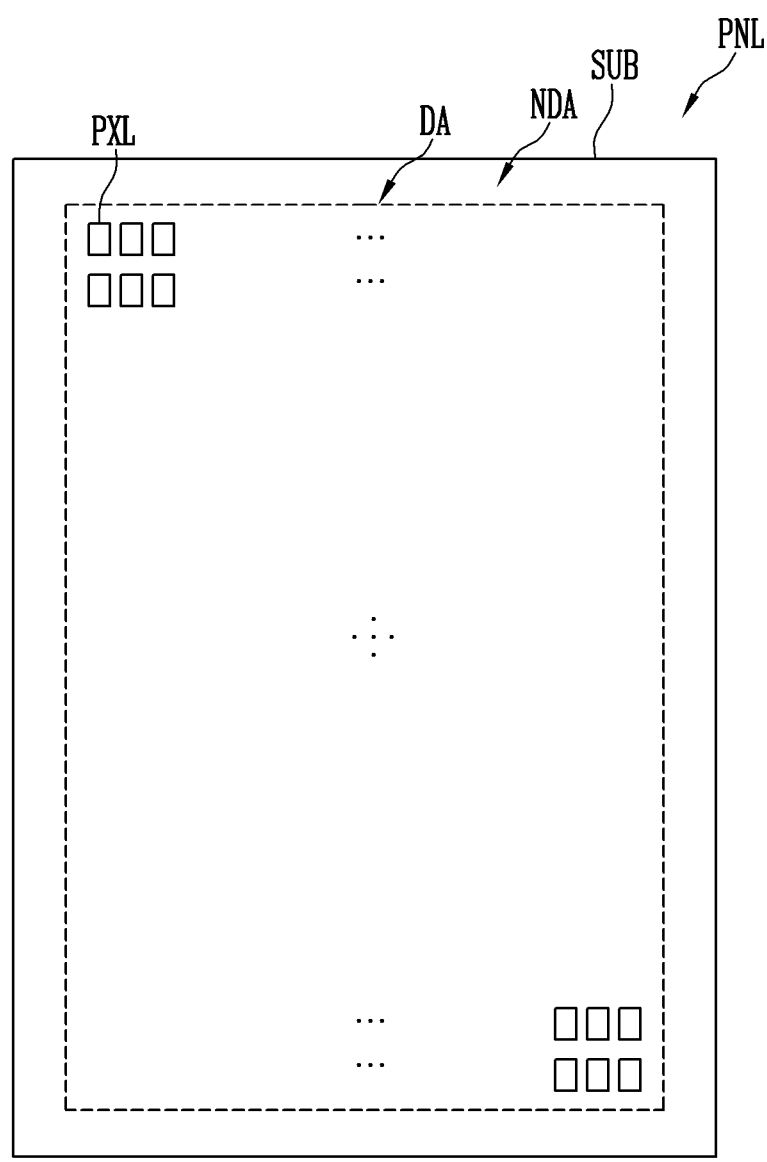
FIG. 11 is a schematic plan diagram illustrating a display device in accordance with an embodiment.

FIG. 11 is a schematic plan diagram illustrating a display device in accordance with an embodiment. FIG. 11 illustrates a display device, specifically, a display panel PNL provided in the display device, as an example of a device capable of using the light emitting device according to the above-described embodiments as a light source. In the embodiment, FIG. 11 schematically illustrates the structure of the display panel PNL with a display area DA in the center thereof. In some embodiments, although not illustrated, at least one driving circuit unit (e.g., at least one of a scan driver and a data driver) and/or lines may be further provided on the display panel PNL.

Referring to FIG. 11, the display panel PNL in accordance with an embodiment may include a substrate SUB and pixels PXL disposed on the substrate SUB. In detail, the substrate SUB may include a display area DA configured to display an image, and a non-display area NDA formed in a predetermined area other than the display area DA. The pixels PXL may be disposed in the display area DA on the substrate SUB.

In an embodiment, the display area DA may be disposed in a central portion of the display panel PNL, and the non-display area NDA may be disposed adjacent to the display panel PNL or may be in a perimeter portion of the display panel PNL to enclose the display area DA. The locations of the display area DA and the non-display area NDA are not limited thereto, and the locations thereof may be changed.

The substrate SUB may be a rigid or flexible substrate, and the material or properties thereof are not particularly limited. For example, the substrate SUB may be a rigid substrate made of glass or reinforced or tempered glass, or a flexible substrate formed of a thin film made of plastic or metal.

A portion of the substrate SUB may be defined as the display area DA in which the pixels PXL may be disposed, and the other portion thereof may be defined as the non-display area NDA. For example, the substrate SUB may include the display area DA including pixel areas on which the respective pixels PXL may be formed, and the non-display area NDA disposed around the display area DA. Various lines and/or internal circuits electrically connected to the pixels PXL of the display area DA may be disposed in the non-display area NDA.

Each of the pixels PXL may include at least one light source configured to be driven by a corresponding scan signal and a corresponding data signal, e.g., the light emitting device described in the foregoing embodiments as a light source. For example, each of the pixels PXL may include a pair of first and second electrodes ELT1 and ELT2, and at least one light emitting diode LD electrically connected between the first and second electrodes ELT1 and ELT2. Furthermore, the light emitting diode LD may be a subminiature rod-type light emitting diode having a small size in a range of a nanoscale to a microscale. In an embodiment, each of the pixels PXL may include light emitting diodes LD electrically connected in parallel with each other between the first and second electrodes ELT1 and ELT2 so that a desired level of luminance may be obtained.

In an embodiment, each pixel PXL may be an active pixel, but the disclosure is not limited thereto. For example, the type, structure, and/or driving method of the pixels PXL in the display device according to the disclosure are not particularly limited. For example, each pixel PXL may be a pixel of various known passive or active light emitting display devices.

Figure 12:
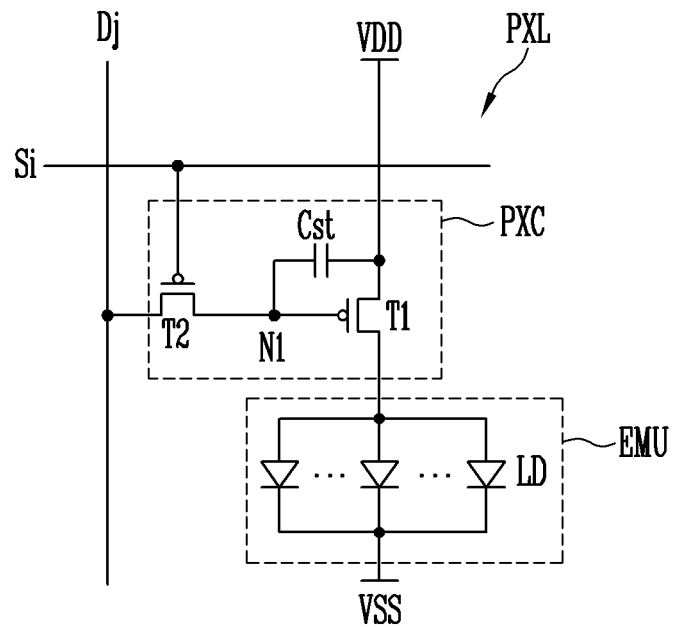
FIGS. 12 to 14 are schematic circuit diagrams illustrating different embodiments of the pixel of FIG. 11.
Figure 13:
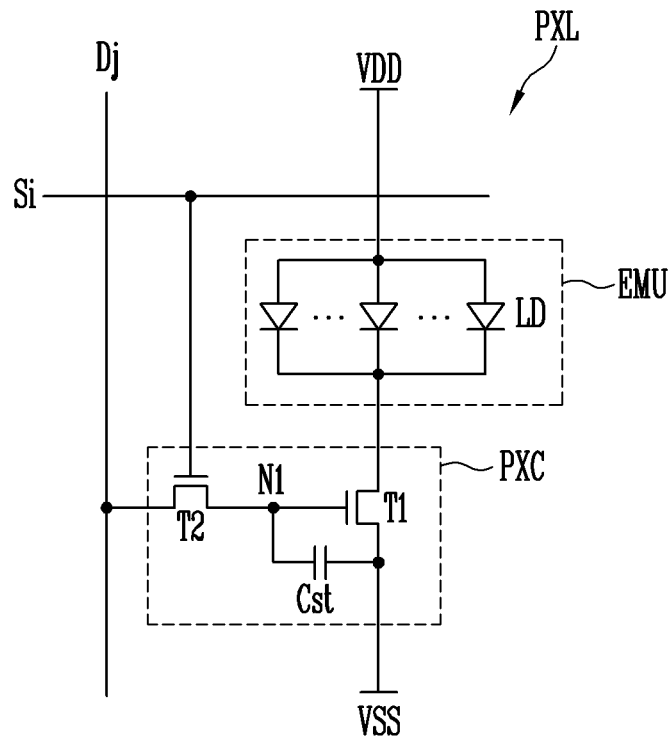
Figure 14:
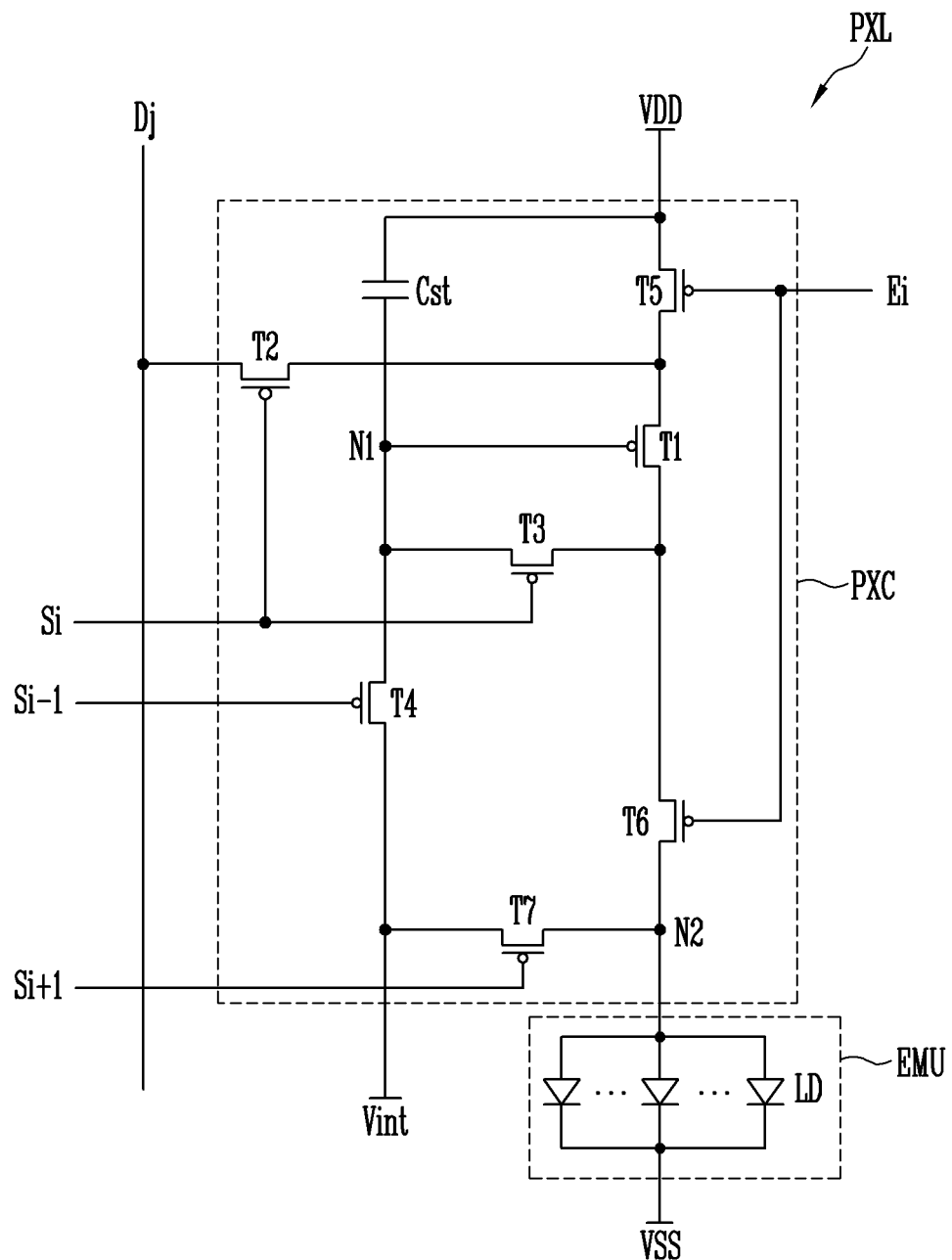

FIGS. 12 to 14 are schematic circuit diagrams illustrating different embodiments of the pixel PXL of FIG. 11. In detail, FIGS. 12 to 14 illustrate different embodiments of the pixel PXL that may be provided in an active light emitting display device. For example, each pixel PXL illustrated in FIGS. 12 to 14 may be one of the pixels PXL provided on the display panel PNL of FIG. 11. The pixels PXL may have substantially the same or similar structure.

Referring to FIG. 12, the pixel PXL in accordance with an embodiment may include a light emission unit EMU configured to generate light having a luminance corresponding to a data signal, and a pixel circuit PXC configured to drive the light emission unit EMU.

In an embodiment, the light emission unit EMU may include light emitting diodes LD electrically connected in parallel with each other between first and second power VDD and VSS. In this case, the first and second power VDD and VSS may have different potentials such that the light emitting diodes LD may emit light. For example, the first power VDD may be set as high-potential power, and the second power VSS may be set as low-potential power. Here, the difference in potential between the first and second power VDD and VSS may be set to be equal to or greater than a threshold voltage of the light emitting diodes LD during at least a light emitting period of the pixel PXL.

Although FIG. 12 illustrates an embodiment in which the light emitting diodes LD forming the light emission unit EMU of each pixel PXL are electrically connected in parallel with each other between the first power VDD and the second power VSS in the same direction (e.g., in a forward direction), the disclosure is not limited thereto. For example, in another embodiment, some of the light emitting diodes LD may be electrically connected to each other in the forward direction between the first and second powers VDD and VSS, and the other light emitting diodes LD may be electrically connected to each other in the reverse direction. As another example, in an embodiment, at least one pixel PXL may include only a single light emitting diode LD.

In an embodiment, an end (e.g., the first end EP1 of FIGS. 4 to 6) of each of the light emitting diodes LD forming (or constituting) each light emission unit EMU may be electrically connected in common to a corresponding pixel circuit PXC through a first electrode (e.g., the first electrode ELT1 of FIGS. 4 to 6) and may be electrically connected to the first power VDD through the pixel circuit PXC. Another end (e.g., the second end EP2 of FIGS. 4 to 6) of the light emitting diode LD may be electrically connected in common to the second power VSS through a second electrode (e.g., the second electrode ELT2 of FIGS. 4 to 6). For the sake of convenience, hereinafter, the first electrode ELT1 and the second electrode ELT2 disposed in each light emission unit EMU will be respectively referred to as a first pixel electrode and a second pixel electrode.

Each light emission unit EMU may emit light having a luminance corresponding to a driving current supplied thereto through the corresponding pixel circuit PXC. Therefore, a predetermined image may be displayed on the display area DA.

The pixel circuit PXC may be electrically connected to a scan line Si and a data line Dj of the corresponding pixel PXL. For example, if the pixel PXL is disposed in an i-th row and a j-th column of the display area DA, the pixel circuit PXC of the pixel PXL may be electrically connected to an i-th scan line Si and a j-th data line Dj of the display area DA. The pixel circuit PXC may include first and second transistors T1 and T2 and a storage capacitor Cst.

A first electrode of the first transistor T1 (driving transistor) may be electrically connected to the first power VDD, and a second electrode thereof may be electrically connected to the light emitting diodes LD through the first pixel electrode (e.g., the first electrode ELT1 of the corresponding light emission unit EMU). Here, the first and second electrodes of the first transistor T1 may be different electrodes. For example, if the first electrode is a source electrode, the second electrode is a drain electrode. A gate electrode of the first transistor T1 may be electrically connected to a first node N1. The first transistor T1 may control the driving current to be supplied to the light emission unit EMU in response to a voltage of the first node N1.

A first electrode of the second transistor T2 (switching transistor) may be electrically connected to the data line Dj, and a second electrode thereof may be electrically connected to the first node N1. A gate electrode of the second transistor T2 may be electrically connected to the scan line Si.

In case that a scan signal of a gate-on voltage (e.g., a low voltage) is supplied from the scan line Si, the second transistor T2 may be turned on to electrically connect the first node N1 to the data line Dj. During each frame period, a data signal of a corresponding frame may be supplied to the data line Dj. The data signal may be transmitted to the first node N1 via the second transistor T2. Therefore, the storage capacitor Cst may be charged with a voltage corresponding to the data signal.

One electrode of the storage capacitor Cst may be electrically connected to the first power VDD, and the other electrode thereof may be electrically connected to the first node N1. The storage capacitor Cst may be charged with a voltage corresponding to the data signal supplied to the first node N1 during each frame period and may maintain the charged voltage until a data signal of a subsequent frame is supplied thereto.

Although the transistors, e.g., the first and second transistors T1 and T2, included in the pixel circuit PXC have been illustrated in FIG. 12 as being P-type transistors, the disclosure is not limited thereto. For example, one of the first and second transistors T1 and T2 may be changed to an N-type transistor.

For example, as illustrated in FIG. 13, the first and second transistors T1 and T2 may be N-type transistors. The configuration and operation of the pixel PXL illustrated in FIG. 13 may be substantially similar to those of the pixel PXL of FIG. 12, except that connection positions of some circuit elements have been changed depending on a change in type of the first and second transistors T1 and T2. Therefore, detailed descriptions of the pixel PXL of FIG. 13 will be omitted.

The structure of the pixel circuit PXC is not limited to the embodiments illustrated in FIGS. 12 and 13. For example, the pixel circuit PXC may be formed of a known pixel circuit which may have various structures and/or may be operated by various driving methods. For example, the pixel circuit PXC and the embodiment illustrated in FIG. 14 may be configured in the same manner.

Referring to FIG. 14, the pixel circuit PXC may be electrically connected not only to a scan line Si of a corresponding horizontal line but also to at least another scan line (or a control line). For example, the pixel circuit PXC of the pixel PXL disposed in the i-th row of the display area DA may be further electrically connected to an i−1-th scan line Si−1 and/or an i+1-th scan line Si+1. In an embodiment, the pixel circuit PXC may be electrically connected not only to the first and second power VDD and VSS but also to a third power. For instance, the pixel circuit PXC may also be electrically connected to an initialization power Vint. In an embodiment, the pixel circuit PXC may include first to seventh transistors T1 to T7 and a storage capacitor Cst.

A first electrode of the first transistor T1 may be electrically connected to the first power VDD via the fifth transistor T5, and a second electrode thereof may be electrically connected to the light emitting diodes LD via the sixth transistor T6. A gate electrode of the first transistor T1 may be electrically connected to a first node N1. The first transistor T1 may control a driving current to be supplied to the light emission unit EMU in response to a voltage of the first node N1.

The second transistor T2 may be electrically connected between the data line Dj and the first electrode of the first transistor T1. A gate electrode of the second transistor T2 may be electrically connected to the corresponding scan line Si. In case that a scan signal of a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 may be electrically connected between the second electrode of the first transistor T1 and the first node N1. A gate electrode of the third transistor T3 may be electrically connected to the corresponding scan line Si. In case that a scan signal of a gate-on voltage is supplied from the scan line Si, the third transistor T3 may be turned on to electrically connect the second electrode of the first transistor T1 to the first node N1. Therefore, if the third transistor T3 is turned on, the first transistor T1 may be connected in the form of a diode (or diode-connected).

The fourth transistor T4 may be electrically connected between the first node Ni and the initialization power Vint. A gate electrode of the fourth transistor T4 may be electrically connected to a preceding scan line, e.g., an i−1-th scan line Si−1. In case that a scan signal of a gate-on voltage is supplied to the i−1-th scan line Si−1, the fourth transistor T4 may be turned on to transmit a voltage of the initialization power Vint to the first node N1. Here, the voltage of the initialization power Vint may be equal to or less than a minimum voltage of a data signal.

The fifth transistor T5 may be electrically connected between the first power VDD and the first transistor T1. A gate electrode of the fifth transistor T5 may be electrically connected to a corresponding emission control line, e.g., an i-th emission control line Ei. The fifth transistor T5 may be turned off in case that an emission control signal of a gate-off voltage (e.g., a high voltage) is supplied to the emission control line Ei and may otherwise be turned on.

The sixth transistor T6 may be electrically connected between the first transistor T1 and a second node N2, which is electrically connected to the light emitting diodes LD. A gate electrode of the sixth transistor T6 may be electrically connected to a corresponding emission control line, e.g., the i-th emission control line Ei. The sixth transistor T6 may be turned off in case that an emission control signal of a gate-off voltage is supplied to the emission control line Ei and may otherwise be turned on.

The seventh transistor T7 may be electrically connected between the light emission unit EMU (e.g., the first pixel electrode electrically connected to the ends of the light emitting diodes LD) and the initialization power Vint, i.e., between the second node N2 and the initialization power Vint. A gate electrode of the seventh transistor T7 may be electrically connected to one of scan lines of a subsequent stage, e.g., the i+1-th scan line Si+1. In case that a scan signal of a gate-on voltage is supplied to the i+1-th scan line Si+1, the seventh transistor T7 may be turned on to supply the voltage of the initialization power Vint to the first pixel electrode.

The storage capacitor Cst may be electrically connected between the first power VDD and the first node N1. The storage capacitor Cst may store a voltage corresponding to the data signal applied to the first node N1 during each frame period and to the threshold voltage of the first transistor T1.

Although the transistors, e.g., the first to seventh transistors T1 to T7, included in the pixel circuit PXC have been illustrated in FIG. 14 as being P-type transistors, the disclosure is not limited thereto. For example, at least one of the first to seventh transistors T1 to T7 may be changed to an N-type transistor.

The structure of the pixel PXL which may be applied to the disclosure is not limited to the embodiment(s) illustrated in FIGS. 12 to 14, and each pixel PXL may have any of various known structures. For example, the pixel circuit PXC included in each pixel PXL may be formed of a kwon pixel circuit which may have various structures and/or may be operated by various driving methods. In an embodiment of the disclosure, each pixel PXL may be configured or included in a passive light emitting display device. In this case, the pixel circuit PXC may be omitted, and each of the first and second pixel electrodes of the light emission unit EMU may be directly connected to the scan line Si, the data line Dj, a power line, and/or the control line.

Figure 15:
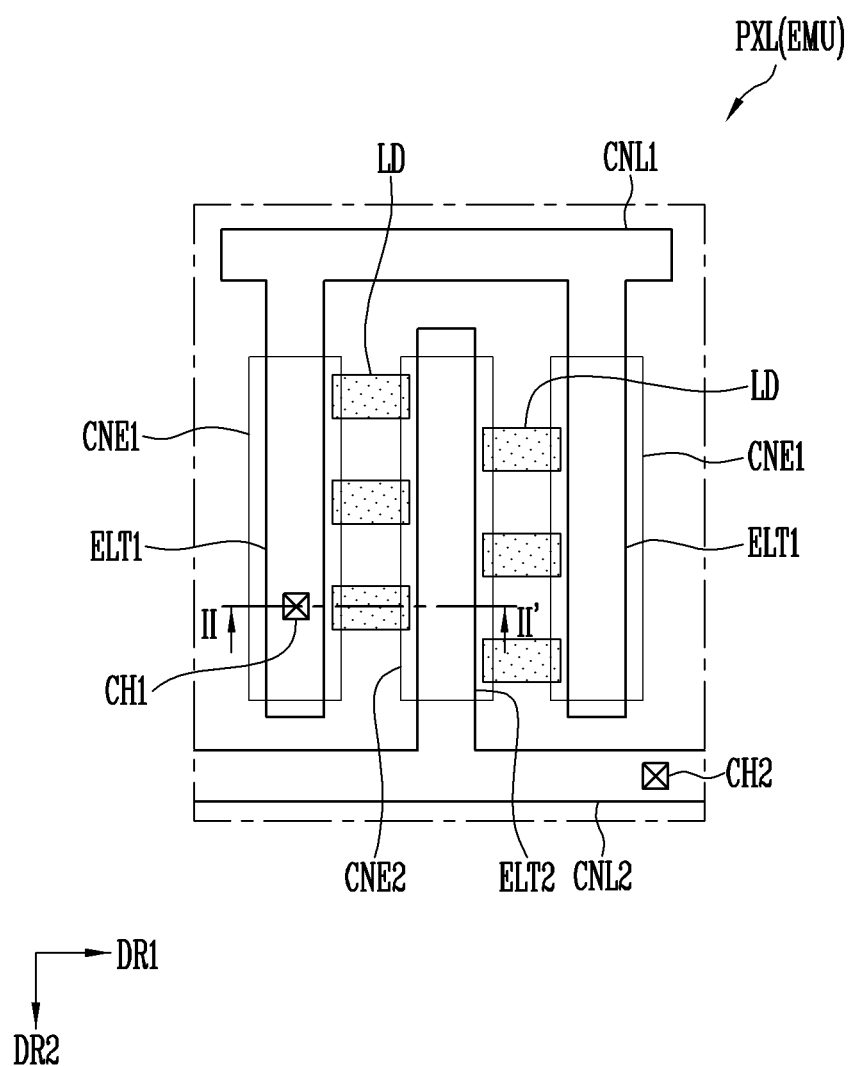
FIG. 15 is a schematic plan diagram illustrating the pixel of FIG. 11 and, particularly, illustrates an embodiment of a layout of a light emission unit of each pixel.
Figure 16:
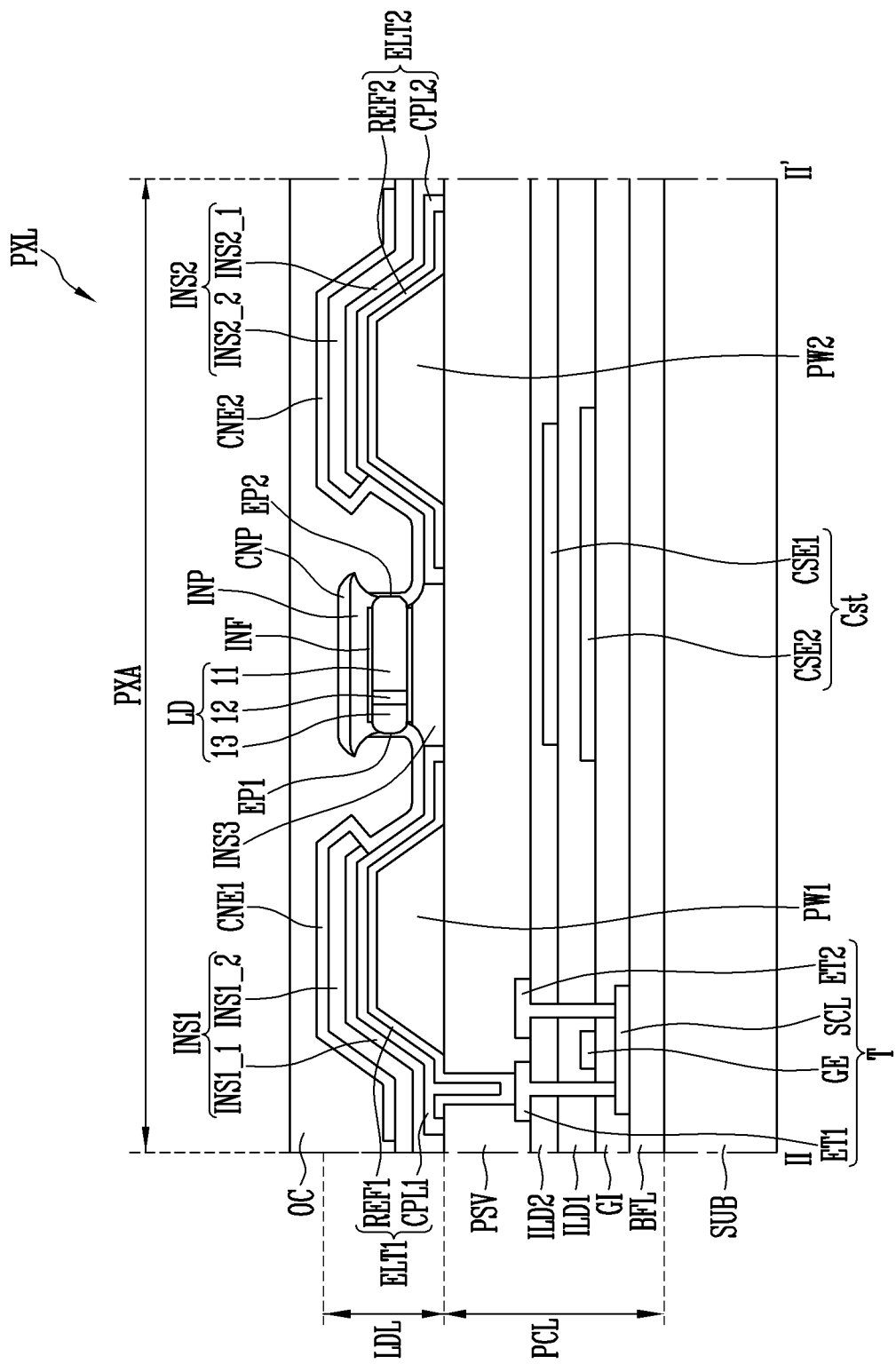
FIG. 16 is a schematic cross-sectional diagram taken along line II-II' of FIG. 15.

FIG. 15 is a schematic plan diagram illustrating the pixel PXL of FIG. 11 and, specifically, illustrates an embodiment of a layout of a light emission unit EMU of each pixel PXL. FIG. 16 is a schematic sectional diagram taken along line of FIG. 15.

In an embodiment, the light emission unit EMU illustrated in FIG. 15 may have a configuration substantially equal or similar to that of the light emitting device according to the above-described embodiment, e.g., the embodiment illustrated in FIG. 4 or the like. A display element layer LDL illustrated in FIG. 16 may have a structure of a cross-section corresponding to the light emission unit EMU of FIG. 15, e.g., substantially identical or similar to that of the cross-section of the light emitting device according to the embodiment illustrated in FIG. 5 or the like. Therefore, in FIGS. 15 and 16, like reference numerals are used to designate the same or similar components as those of the embodiments of FIGS. 4 and 5, and detailed descriptions thereof will be omitted.

Referring to FIGS. 15 to 16, each pixel PXL may include a pixel circuit layer PCL and the display element layer LDL that are sequentially stacked on the substrate SUB.

In an embodiment, the pixel circuit layer PCL may include circuit elements disposed in the display area DA. For example, the pixel circuit layer PCL may include circuit elements which are formed in respective pixel areas PXA to form the respective pixel circuits PXC. For instance, the pixel circuit layer PCL may include at least one transistor T and at least one storage capacitor Cst which are disposed in each pixel area PXA. For the sake of convenience, FIG. 15 illustrates representatively only a transistor T that is directly connected to a first electrode ELT1 (e.g., a first pixel electrode) of the display element layer LDL among transistors provided in the pixel circuit PXC. The transistors forming the respective pixel circuits PXC may have substantially the same or similar cross-sectional structure. Furthermore, in the disclosure, the structure of each transistor T is not limited to that of the embodiment illustrated in FIG. 16. For example, each transistor T may have any of various cross-sectional structures known in the art. Furthermore, in another embodiment of the disclosure, transistors forming the respective pixel circuits PXC may have different types and/or structures.

The pixel circuit layer PCL may include insulating layers. For example, the pixel circuit layer PCL may include a gate insulating layer GI, first and second interlayer insulating layers ILD1 and ILD2, and a passivation layer PSV, which are sequentially stacked on a surface of the substrate SUB.

In an embodiment, the gate insulating layer GI, the first and second interlayer insulating layers ILD1 and ILD2, and the passivation layer PSV may be sequentially stacked between the substrate SUB and the display element layer LDL. The pixel circuit layer PCL may further include at least one buffer layer BFL disposed between the substrate SUB and the circuit elements. In an embodiment, at least one of the buffer layer BFL, the gate insulating layer GI, the first and second interlayer insulating layers ILD1 and ILD2, and the passivation layer PSV may be formed on a surface of the substrate SUB including the display area DA and the non-display area NDA.

In an embodiment, the buffer layer BFL may prevent impurities from diffusing into each transistor T. The buffer layer BFL may be formed as a single layer or may be formed of multiple layers having at least two or more layers. In case that the buffer layer BFL has a multi-layer structure, the respective layers may be formed of the same material or different materials. In an embodiment, the buffer layer BFL may be omitted.

In an embodiment, each transistor T may include a semiconductor layer SCL, a gate electrode GE, a first transistor electrode ET1, and a second transistor electrode ET2. Although FIG. 16 illustrates an embodiment in which each transistor T includes the first and second transistor electrodes ET1 and ET2 that are formed separately from the semiconductor layer SCL, the disclosure is not limited thereto. For example, in an embodiment, in lieu of the structure in which at least one transistor T disposed in each pixel area PXA separately includes the first and/or second transistor electrode ET1 and/or ET2, the first and/or second transistor electrode ET1 and/or ET2 may be integral with the semiconductor layer SCL.

The semiconductor layer SCL may be disposed on the buffer layer BFL. For example, the semiconductor layer SCL may be disposed between the gate insulating layer GI and the substrate SUB on which the buffer layer BFL is formed. The semiconductor layer SCL may include a first portion which electrically contacts the first transistor electrode ET1, a second portion which electrically contacts the second transistor electrode ET2, and a channel portion disposed between the first and second portions. In an embodiment, one of the first and second portions may be a source area, and the other may be a drain area.

In an embodiment, the semiconductor layer SCL may be a semiconductor pattern formed of polysilicon, amorphous silicon, an oxide semiconductor, or the like. The channel portion of the semiconductor layer SCL may be an intrinsic semiconductor, which is a semiconductor pattern not doped with an impurity. Each of the first and second portions of the semiconductor layer SCL may be a semiconductor pattern doped with a predetermined impurity (or impurities).

The gate electrode GE may be disposed on the semiconductor layer SCL with the gate insulating layer GI interposed therebetween. For example, the gate electrode GE may be disposed between the gate insulating layer GI and the first interlayer insulating layer ILD1 and may overlap at least a portion of the semiconductor layer SCL.

The first and second transistor electrodes ET1 and ET2 may be disposed on the semiconductor layer SCL with at least one insulating layer, e.g., insulating layers, interposed between the semiconductor layer SCL and the first and second transistor electrodes ET1 and ET2. For example, the first and second transistor electrodes ET1 and ET2 may be disposed between the second interlayer insulating layer ILD2 and the passivation layer PSV. The first and second transistor electrodes ET1 and ET2 may be electrically connected to the semiconductor layer SCL. For example, the first and second transistor electrodes ET1 and ET2 may respectively and electrically contact the first portion and the second portion of the semiconductor layer SCL through contact holes which respectively pass through the first and second interlayer insulating layers ILD1 and ILD2 and the gate insulating layer GI.

In an embodiment, one of the first and second transistor electrodes ET1 and ET2 may be electrically connected to the first electrode ELT1, e.g., the first pixel electrode, of the display element layer LDL disposed on the passivation layer PSV by at least one contact hole (e.g., a first contact hole CH1) passing through the passivation layer PSV. However, this structure may be changed by transistor depending on a connection position or the like of each transistor T.

In an embodiment, the storage capacitor Cst may include first and second capacitor electrodes CSE1 and CSE2 disposed on different layers to be spaced apart from each other. For example, the first capacitor electrode CSE1 may be disposed between the first and second interlayer insulating layers ILD1 and ILD2. The second capacitor electrode CSE2 may be disposed on at least one conductive layer that forms the transistor T. For example, the second capacitor electrode CSE2 and at least one of the semiconductor layer SCL, the gate electrode GE, and the first and second transistor electrodes ET1 and ET2 may be disposed on a same layer. For example, the second capacitor electrode CSE2 may be disposed between the gate insulating layer GI and the first interlayer insulating layer ILD1 along with the gate electrode GE of the transistor T.

For the sake of description, FIG. 16 illustrates that each of the first and second capacitor electrodes CSE1 and CSE2 is formed of a single layer, but the disclosure is not limited thereto. For example, at least one of the first and second capacitor electrodes CSE1 and CSE2 may be formed of multiple layers, and the stacked structures and/or positions of the first and second capacitor electrodes CSE1 and CSE2 may be changed in various ways.

The display element layer LDL may be a layer in which the light emission unit EMU of each pixel PXL is disposed. For example, the display element layer LDL and the light emitting device described with reference to FIGS. 4 and 5 may be formed in the same manner. For example, the display element layer LDL may include first and second electrodes ELT1 and ELT2 disposed in each pixel area PXA on the pixel circuit layer PCL, and at least one light emitting diode LD electrically connected between the first and second electrodes ELT1 and ELT2. For example, the display element layer LDL may include light emitting diodes LD which are formed on the pixel circuit layer PCL in each pixel area PXA and may form each light emission unit EMU.

In an embodiment, the first electrode ELT1, e.g., the first pixel electrode, of the display element layer LDL may be electrically connected with a circuit element, e.g., at least one transistor T, of the pixel circuit layer PCL through the first contact hole CH1. The second electrode ELT2, e.g., the second pixel electrode, of the display element layer LDL may be electrically connected with a power line (or a control line), which is not illustrated, through a second contact hole CH2. In an embodiment, the power line and at least one conductive layer formed on the pixel circuit layer PCL may be disposed on or in the same layer. The power line may be electrically connected with the second electrode ELT2 of the display element layer LDL through the second contact hole CH2, but the disclosure is not limited thereto.

As described in the foregoing embodiment, the light emission unit EMU of each pixel PXL may be formed of a light emitting device using at least one light emitting diode LD. Since the light emitting device according to an embodiment of the disclosure has been described above, detailed descriptions of each light emission unit EMU corresponding to the light emitting device and the display element layer LDL forming the light emission unit EMU will be omitted.

While the spirit and scope of the disclosure are described by detailed exemplary embodiments, it should be noted that the above-described embodiments are merely descriptive and should not be considered limiting. It should be understood by those skilled in the art that various changes, substitutions, and alternations may be made herein without departing from the scope of the disclosure as defined by the following claims.

The scope of the disclosure is not limited by detailed descriptions of the specification and should be defined by the accompanying claims. Furthermore, all changes or modifications of the disclosure derived from the meanings and scope of the claims, and equivalents thereof should be construed as being included in the scope of the disclosure.

What is claimed is:

1. A light emitting device comprising:
   a first electrode and a second electrode disposed on a substrate and spaced apart from each other;
   at least one light emitting diode disposed between the first electrode and the second electrode, the at least one light emitting diode including a first end and a second end on sides in a longitudinal direction of the at least one light emitting diode;
   an insulating pattern overlapping an upper portion of the at least one light emitting diode and exposing the first and the second ends of the at least one light emitting diode;
   a first contact electrode electrically connecting the first end of the at least one light emitting diode to the first electrode; and
   a second contact electrode electrically connecting the second end of the at least one light emitting diode to the second electrode, wherein
   the insulating pattern completely overlaps the first and the second ends of the at least one light emitting diode in a plan view, and
   the insulating pattern has a shape in which a width of the insulating pattern reduces toward a lower portion of the insulating pattern in a cross-sectional view.

2. The light emitting device according to claim 1, wherein the first and the second contact electrodes electrically contact side surfaces of the at least one light emitting diode on the first and the second ends of the at least one light emitting diode, respectively, and
   an end of each of the first and the second contact electrodes electrically contacts the lower portion of the insulating pattern without extending to an upper surface of the at least one light emitting diode.

3. The light emitting device according to claim 1, wherein the at least one light emitting diode is disposed between the first and second contact electrodes which are spaced apart from each other, and
   the first and second contact electrodes are disposed on a same layer or at a same height.

4. The light emitting device according to claim 1, wherein the insulating pattern comprises:
   a first side surface disposed on the first end of the at least one light emitting diode, the first side surface including an inclined surface or a curved surface; and a second side surface disposed on the second end of the at least one light emitting diode, the second side surface including an inclined surface or a curved surface.

5. The light emitting device according to claim 4, wherein an upper end of the first side surface is spaced apart from the first end of the at least one light emitting diode in a direction toward the first electrode by a distance equal to or greater than a thickness of the first and the second contact electrodes in a plan view, and an upper end of the second side surface is spaced apart from the second end of the at least one light emitting diode in a direction toward the second electrode by a distance equal to or greater than the thickness of the first and the second contact electrodes in the plan view.

6. The light emitting device according to claim 1, wherein the insulating pattern has a thickness equal to or greater than a thickness of each of the first and the second contact electrodes.

7. The light emitting device according to claim 1, further comprising:
at least one first insulating layer disposed between the first electrode and a portion of the first contact electrode; and
at least one second insulating layer disposed between the second electrode and a portion of the second contact electrode.

8. The light emitting device according to claim 7, wherein the insulating pattern has a thickness less than a thickness of each of the first and the second insulating layers.

9. The light emitting device according to claim 1, wherein an upper surface of the insulating pattern has a width greater than a length of the at least one light emitting diode.

10. The light emitting device according to claim 1, further comprising:
a conductive pattern disposed on the insulating pattern, overlapping the at least one light emitting diode, and separated from the at least one light emitting diode and the first and the second contact electrodes by the insulating pattern.

11. The light emitting device according to claim 10, wherein the conductive pattern includes a material identical to a material of the first and the second contact electrodes and is electrically isolated.

12. The light emitting device according to claim 1, further comprising a third insulating layer disposed between the substrate and the at least one light emitting diode.

13. The light emitting device according to claim 1, wherein the at least one light emitting diode is horizontally disposed on a surface of the substrate and oriented in a lateral direction of the light emitting device between the first electrode and the second electrode.

14. The light emitting device according to claim 1, wherein the at least one light emitting diode comprises a rod-type light emitting diode having a diameter or a length in a range of nanoscale to microscale.

15. A method of fabricating a light emitting device, comprising:
forming first and second electrodes spaced apart from each other on a substrate;
forming a first insulating material layer on the substrate on which the first and the second electrodes are formed;
supplying at least one light emitting diode on the substrate on which the first insulating material layer is formed;
aligning the at least one light emitting diode between the first and the second electrodes such that first and second ends of the at least one light emitting diode are respectively adjacent to the first and the second electrodes;
forming a second insulating material layer on the substrate on which the at least one light emitting diode is aligned;
forming a mask on the substrate on which the second insulating material layer is formed;
etching the first and the second insulating material layers such that at least a portion of the first electrode, at least a portion of the second electrodes, and the first and the second ends of the at least one light emitting diode are exposed; and
forming first and second contact electrodes electrically connecting the first and the second ends of the at least one light emitting diode to the first and the second electrodes, respectively,
wherein the etching of the first and the second insulating material layers comprises:
etching the second insulating material layer over sides of the at least one light emitting diode on which the first and the second ends are located, and
forming an insulating pattern to completely overlap the first and the second ends of the at least one light emitting diode in a plan view and to have a width reducing toward a lower portion of the insulating pattern adjacent to the at least one light emitting diode.

16. The method according to claim 15, wherein the forming of the mask comprises:
forming a photoresist layer on the substrate on which the second insulating material layer is formed; and
forming first and second openings in the photoresist layer so that the second insulating material layer over the first and the second electrodes is partially exposed at positions respectively spaced apart from the first and the second ends by a predetermined distance.

17. The method according to claim 15, wherein, the forming of the first and second contact electrodes comprises forming a conductive pattern separated from the at least one light emitting diode and the first and the second contact electrodes on the insulating pattern.

18. The method according to claim 15, wherein the first and the second electrodes are simultaneously formed on a same layer.

19. The method according to claim 15, wherein the first and the second contact electrodes are simultaneously formed on a same layer.

20. A display device comprising:
a substrate including a display area; and
a pixel disposed in the display area, the pixel comprising:
a first electrode and a second electrode disposed on the substrate and spaced apart from each other;
at least one light emitting diode disposed between the first electrode and the second electrode, the at least one light emitting diode including a first end and a second end on sides in a longitudinal direction of the at least one light emitting diode;
an insulating pattern disposed to overlap an upper portion of the at least one light emitting diode and exposing the first and second ends of the at least one light emitting diode;
a first contact electrode electrically connecting the first end of the at least one light emitting diode to the first electrode; and
a second contact electrode electrically connecting the second end of the at least one light emitting diode to the second electrode, and
wherein the insulating pattern completely overlaps the first and the second ends of the at least one light emitting diode in a plan view and has a shape in which a width of the insulating pattern reduces toward a lower portion of the insulating pattern in a cross-sectional view.

* * * * *